(12) United States Patent
Okubo et al.

(10) Patent No.: US 9,449,684 B2
(45) Date of Patent: Sep. 20, 2016

(54) STORAGE CONTROL DEVICE, STORAGE DEVICE, INFORMATION PROCESSING SYSTEM, AND STORAGE CONTROL METHOD

(71) Applicant: Sony Corporation, Tokyo (JP)

(72) Inventors: Hideaki Okubo, Saitama (JP); Kenichi Nakanishi, Tokyo (JP); Yasushi Fujinami, Tokyo (JP); Lui Sakai, Kanagawa (JP)

(73) Assignee: Sony Corporation, Tokyo (JP)

( * ) Notice: Subject to any disclaimer, the term of this patent is extended or adjusted under 35 U.S.C. 154(b) by 106 days.

(21) Appl. No.: 14/454,214

(22) Filed: Aug. 7, 2014

(65) Prior Publication Data

US 2015/0049538 A1   Feb. 19, 2015

(30) Foreign Application Priority Data

Aug. 19, 2013   (JP) ................. 2013-169503

(51) Int. Cl.
    *G11C 13/00* (2006.01)
    *G11C 29/42* (2006.01)
    *G11C 29/56* (2006.01)

(52) U.S. Cl.
    CPC ......... *G11C 13/004* (2013.01); *G11C 13/0002* (2013.01); *G11C 13/0007* (2013.01); *G11C 13/0033* (2013.01); *G11C 13/0035* (2013.01); *G11C 13/0069* (2013.01); *G11C 29/42* (2013.01); *G11C 29/56* (2013.01); *G11C 2013/0076* (2013.01)

(58) Field of Classification Search
    CPC .................. G11C 13/004; G11C 13/0002
    USPC ......................................... 365/148
    See application file for complete search history.

(56) References Cited

U.S. PATENT DOCUMENTS

| 5,798,966 A | * | 8/1998 | Keeney | G11C 16/30 365/185.18 |
| 6,046,937 A | * | 4/2000 | Komori | G11C 16/3495 365/185.04 |
| 6,145,069 A | * | 11/2000 | Dye | H03M 7/30 345/501 |

FOREIGN PATENT DOCUMENTS

JP          06-110793          4/1994

* cited by examiner

*Primary Examiner* — Hoai V Ho
*Assistant Examiner* — Muna A Techane
(74) *Attorney, Agent, or Firm* — K&L Gates LLP

(57) ABSTRACT

Provided is a storage control device including: a detection unit which detects a first timing for performing a first rewriting process of performing only a first operation from among the first operation and a second operation, in a memory cell array in which each bit transitions to a first storage state by the first operation and transitions to a second storage state by the second operation; and a request unit which makes a request for the first rewriting process with respect to the memory cell array, when the first timing is detected.

16 Claims, 36 Drawing Sheets

FIG. 26

| PHYSICAL ADDRESS | NUMBER OF TIMES OF READING | NUMBER OF TIMES POWER HAS TURNED ON WHEN UPDATING DATA |
|---|---|---|
| 0x00000000 | 3000 | 1 |
| 0x00000001 | 169 | 813 |
| ⋮ | ⋮ | ⋮ |
| 0x09000000 | 6791 | 1684 |

FIG. 31

| PHYSICAL ADDRESS | DATE OF LRS CELL LAST REFRESH | DATE OF HRS CELL LAST REFRESH |
|---|---|---|
| 0x00000000 | 07/07/2013 | 07/07/2013 |
| 0x00000001 | 12/31/2011 | 12/31/2009 |
| ⋮ | ⋮ | ⋮ |
| 0x09000000 | 09/29/2012 | 09/29/2010 |

STORAGE CONTROL DEVICE, STORAGE DEVICE, INFORMATION PROCESSING SYSTEM, AND STORAGE CONTROL METHOD

CROSS REFERENCES TO RELATED APPLICATIONS

The present application claims priority to Japanese Priority Patent Application JP 2013-169503 filed in the Japan Patent Office on Aug. 19, 2013, the entire content of which is hereby incorporated by reference.

BACKGROUND

The present application relates to a storage control device. The present application specifically relates to a storage control device, a storage device, and an information processing system for a non-volatile memory, a processing method thereof, and a program for executing the method by a computer.

A dynamic random access memory (DRAM) or the like is used as a work memory in an information processing system. The DRAM is normally a volatile memory, and loses stored content therein when supply of power is stopped. Meanwhile, in recent years, a non-volatile memory (NVM) has been used. The non-volatile memory is broadly divided into a flash memory corresponding to a data access using units of a large size, and a non-volatile random access memory (NVRAM) which can perform a rapid random access using small units. Herein, a NAND-type flash memory is used as a representative example of the flash memory. Meanwhile, a resistance RAM (ReRAM), a phase-change RAM (PCRAM), a magnetoresistive RAM (MRAM), or the like is used as the non-volatile random access memory.

In general, in the non-volatile memory, data is read out by applying a voltage with respect to a memory cell. As the data is read out, the memory cell receives stress caused by the voltage. By repeating the reading-out of the data, that is, repeatedly applying stress caused by the voltage with respect to the memory cell, written data may be destroyed and an erroneous value may be read out from the memory cell. With respect to this, a technology of performing correction of data using an error correction code and rewriting the corrected data to a non-volatile memory to prevent data destruction, when an error is detected from the read-out data has been proposed (for example, see Japanese Unexamined Patent Application Publication No. 06-1107931.

SUMMARY

In the technology of the related art, data destruction is prevented by rewriting corrected data to a non-volatile memory, which is a so-called refreshing process. However, in the technology of the related art, removal and writing are performed with respect to all memory cells belonging to at least the same physical page, including a memory cell in which an error is generated. Data removal and writing of a memory cell in which rewriting of data is not necessary may be a reason for the long time taken for a process. In addition, the data removal and writing of a memory cell in which rewriting of data is not necessary may be a reason for increased stress applied to the memory cell and a short life of the non-volatile memory.

In the present application, it is desirable to simplify a process of performing rewriting to a memory.

According to a first embodiment of the present application, there is provided a storage control device or a method thereof including: a detection unit which detects a first timing for performing a first rewriting process of performing only a first operation from among the first operation and a second operation, in a memory cell array in which each bit transitions to a first storage state by the first operation and transitions to a second storage state by the second operation; and a request unit which makes a request for the first rewriting process with respect to the memory cell array, when the first timing is detected. Accordingly, when there is significant degradation of bits supposed to be in the first storage state, for example, by using the rewriting process of performing only the first operation, the rewriting process with respect to the memory cell array is simplified.

In the first embodiment, the detection unit may detect the first timing when the number of bits obtained by reading out bits supposed to be in the first storage state as bits in second storage state is greater than a predetermined number of bits. Accordingly, the rewriting process is switched based on the number of errors of bits supposed to be in the degraded first storage state, for example. In this case, the detection unit may start detection of the first timing, when the number of errors detected in the memory cell array is greater than a predetermined number of errors.

In the first embodiment, the detection unit may compare the number of bits in the second storage state when predetermined data is written to the memory cell array, and the number of bits in the second storage state when the predetermined written data is read out from the memory cell array, and detect the first timing when the number of bits in the second storage state when the data is read out is greater. Accordingly, the rewriting process is switched based on the number of bits in the second storage state before and after the writing. In this case, the detection unit may start the detection of the first timing, when a difference between the number of bits in the second storage state when the data is written and the number of bits in the second storage state when the data is read out is greater than a predetermined number.

In the first embodiment, the storage control device may further include an information management unit which records the number of times of reading for each physical address regarding the memory cell array, and the detection unit may detect the first timing for the physical address in which the number of times of reading reaches a predetermined number of times. Accordingly, the rewriting process is switched based on the number of times of reading. In this case, the information management unit may further record the number of times the power of the memory cell has been turned on, after making a request for a rewriting process of performing both the first operation and the second operation with respect to the memory cell array, and the detection unit may make a request for the rewriting process of performing both the first operation and the second operation with respect to the memory cell array, when the number of times the power has been turned on reaches a predetermined number of times.

In the first embodiment, the detection unit may perform the detection of the first timing during execution of a reading command for performing reading-out from the memory cell array. Accordingly, the rewriting process is performed each time of executing the reading command.

In the first embodiment, the detection unit may spontaneously perform the detection of the first timing in a state where a command for accessing the memory cell array is not executed. Accordingly, the storage control device performs the rewriting process at a spontaneous timing.

In the first embodiment, the detection unit may detect the first timing when a predetermined period has elapsed after a first rewriting process is performed in the memory cell array. Accordingly, the rewriting process is performed according to the time elapsed from the last time point when the rewriting process is performed.

In the first embodiment, the detection unit may further detect a second timing for performing a second rewriting process of performing both the first operation and the second operation, and the request unit may make a request for the second rewriting process with respect to the memory cell array when the second timing is detected. Accordingly, the second rewriting process is performed when the first rewriting process is insufficient.

According to a second embodiment of the present application, there is provided a storage device including: a memory cell array in which each bit transitions to a first storage state by a first operation and transitions to a second storage state by a second operation; a detection unit which detects a first timing for performing a first rewriting process of performing only the first operation from among the first operation and the second operation in the memory cell array; and a request unit which makes a request for the first rewriting process with respect to the memory cell array, when the first timing is detected. Accordingly, when there is significant degradation of bits supposed to be in the first storage state, for example, by using the rewriting process of performing only the first operation, the rewriting process with respect to the memory cell array is simplified.

In the second embodiment, each bit of the memory cell array may be formed of a variable resistance element, the first storage state may be a low resistance state, the second storage state may be a high resistance state, the first operation may be a setting operation for transitioning the bit to the low resistance state, and the second operation may be a resetting operation for transitioning the bit to the high resistance state.

According to a third embodiment of the present application, there is provided an information processing system including: a memory cell array in which each bit transitions to a first storage state by a first operation and transitions to a second storage state by a second operation; a host computer which issues a reading command with respect to the memory cell array; a detection unit which detects a first timing for performing a first rewriting process of performing only the first operation from among the first operation and the second operation regarding execution of the reading command; and a request unit which makes a request for the first rewriting process with respect to the memory cell array, when the first timing is detected. Accordingly, regarding the execution of the reading command issued by the host computer to the memory cell array, when there is significant degradation of bits supposed to be in the first storage state, for example, the rewriting process of the memory cell array is simplified by using the rewriting process of performing only the first operation.

According to the embodiments of the present application, an excellent effect of simplifying the process of performing the rewriting of the memory is obtained.

Additional features and advantages are described herein, and will be apparent from the following Detailed Description and the figures.

BRIEF DESCRIPTION OF THE FIGURES

FIG. 26 is a diagram showing a configuration example of a refreshing information management table according to a fourth embodiment of the present application;

FIG. 31 is a diagram showing a configuration example of a refreshing information management table according to a fifth embodiment of the present application;

DETAILED DESCRIPTION

Hereinafter, embodiments for realizing the present application (hereinafter, referred to as embodiments) will be described. The embodiments will be described in the following order.

1. First Embodiment (Control Based on Number of Errors in Degraded Low Resistance State: at the Time of Reading Command Execution)
2. Second Embodiment (Control Based on Number of Errors in Degraded Low Resistance State: Spontaneous)
3. Third Embodiment (Control Based on Number of Bits in High Resistance State Before and After Writing)
4. Fourth Embodiment (Control Based on Number of Times of Reading)
5. Fifth Embodiment (Control Based on Time Elapsed After Refreshing)
6. Other Modification Examples

1. FIRST EMBODIMENT

Configuration of Information Processing System

Figure 1:
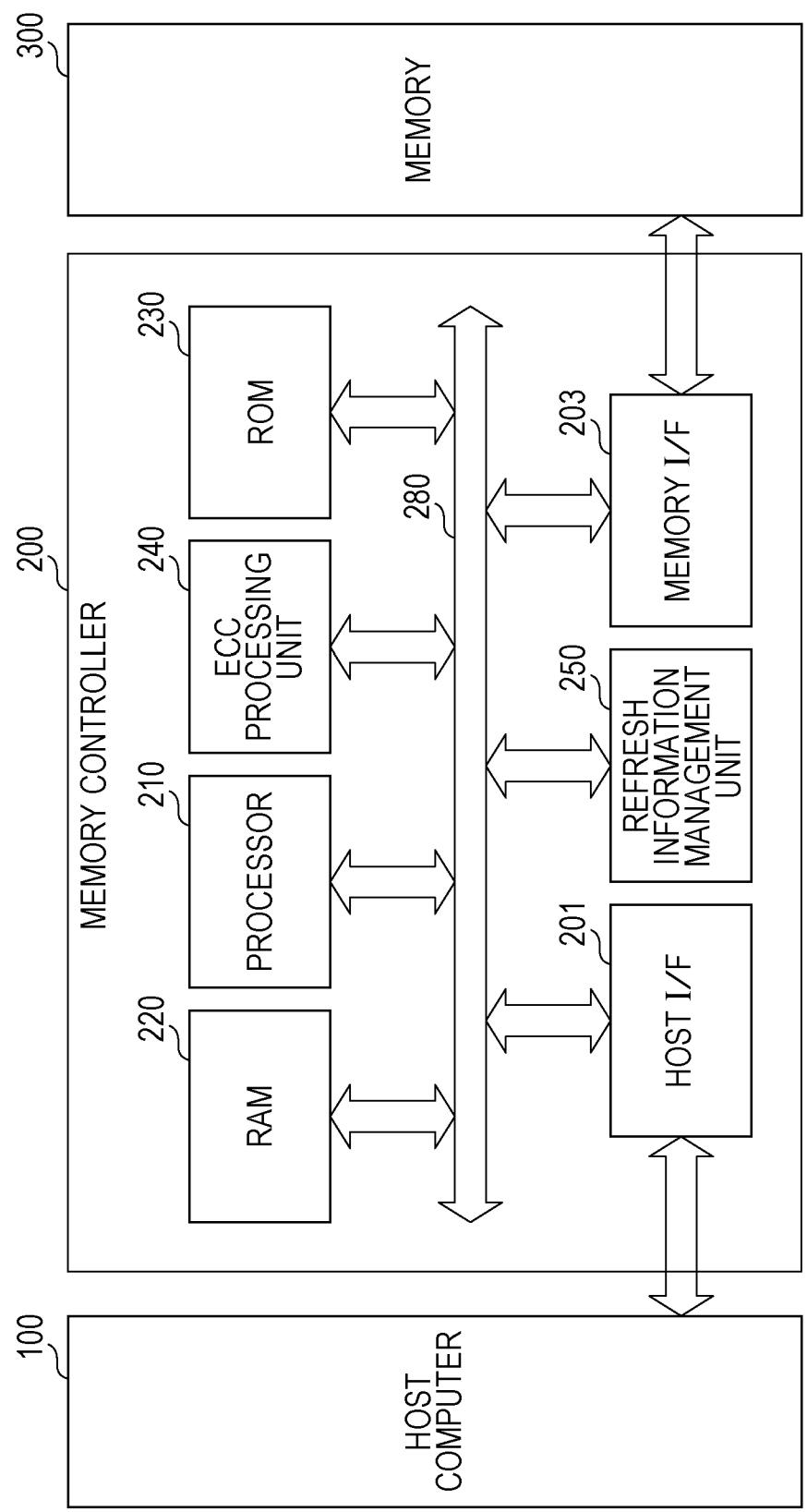
FIG. 1 is a diagram showing a configuration example of an information processing system according to an embodiment of the present application.

FIG. 1 is a diagram showing a configuration example of an information processing system according to an embodiment of the present application. This information processing system is configured with a host computer 100, a memory controller 200, and a memory 300. The memory controller 200 and the memory 300 configure a storage system.

The host computer 100 issues a command for making a request for a reading process, a writing process, or a refreshing process of data with respect to the memory 300.

The memory controller 200 communicates with the host computer 100 and receives the command, and executes data writing to the memory 300 and data reading-out from the memory 300. When a writing command is received, the memory controller 200 performs instruction of writing of data received from the host computer 100 to the memory 300. In addition, when a reading command is received, the memory controller 200 reads out data from the memory 300 and transmits the data to the host computer 100. Further, when a refreshing command is received, the memory controller 200 performs instruction so as to read out data from the memory 300 and to rewrite the read-out data to the memory 300.

When the host computer 100 executes the writing command, the reading command, and the refreshing command, a logical address is used as an address showing location information of the data in the memory controller 200. It is assumed that an area shown by one logical address has a size of 512 bytes. Meanwhile, when the memory controller 200 makes a request for writing or reading, a physical address is used as an address showing location information of data in the memory 300. It is assumed that an area shown by one physical address has a size of 528 bytes (4224 bits).

The memory controller 200 includes a processor 210, a RAM 220, a ROM 230, an ECC processing unit 240, a refreshing information management unit 250, a host interface 201, and a memory interface 203.

The processor 210 controls the entire memory controller 200. The processor 210 executes software stored in the ROM 230. The processor 210 interprets the commands issued from the host computer 100 and makes a necessary request with respect to the memory 300. The processor 210 is an example of a request unit of the claims.

The RAM 220 is a volatile memory, and is used as a working memory of the processor 210 or an area for temporarily retaining data for managing the memory 300. In addition, the RAM 220 is also used as an area for temporarily retaining data transmitted between the host computer 100 and the memory controller 200, or an area for temporarily retaining data transmitted between the memory controller 200 and the memory 300. Further, the RAM 220 retains an address conversion table. The address conversion table is a table for converting a logical address designated by the host computer 100 with a command into the corresponding physical address. In this embodiment, the logical address is set to have 512 bytes. The data having 512 bytes written in one logical address is written to one physical page of the memory 300 as user data. Accordingly, one physical address is allocated to one logical address. The ROM 230 is a memory which stores a software program for controlling a storage system.

The ECC processing unit 240 executes generation of an error correcting code (ECC) of the data recorded in the memory 300, and error detection and a correction process for the data read out from the memory 300. The ECC processing unit 240 has correction capability of 8 bits. The number of redundant bits assumed at that time is 13 bytes (104 bits). The ECC processing unit 240 is an example of a detection unit of claims.

The refreshing information management unit 250 manages information necessary when determining whether or not execution of the refreshing process is necessary.

The host interface 201 is connected to the host computer 100, and executes reception of a command from the host computer 100 and reception and transmission of data from and to the host computer 100.

The memory interface 203 is connected to the memory 300, and executes reception of the request, transmission of data to be written, and reception of read data with respect to the memory 300.

Configuration of Memory

Figure 2:
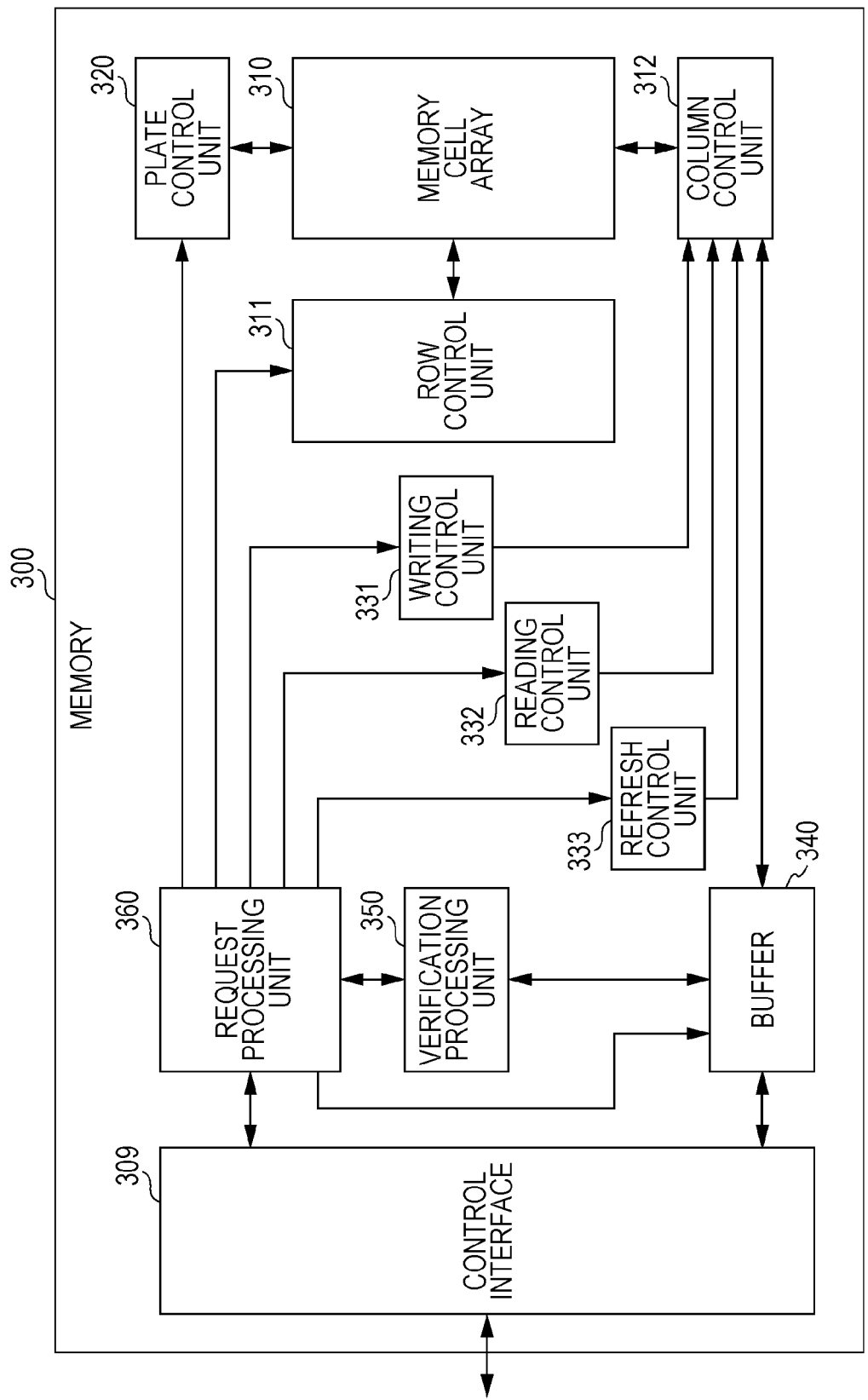
FIG. 2 is a diagram showing a configuration example of a memory according to an embodiment of the present application.

FIG. 2 is a diagram showing a configuration example of the memory 300 according to the embodiment of the present application. The memory 300 includes a memory cell array 310, a row control unit 311, a column control unit 312, and a plate control unit 320. In addition, the memory 300 includes a writing control unit 331, a reading control unit 332, a refreshing control unit 333, a buffer 340, a verification processing unit 350, and a request processing unit 360.

Further, the memory 300 includes a control interface 309 which is an interface between the memory and the memory controller 200. The control interface 309 performs reception of a request or a physical address and a parameter from the memory controller 200, reception of the data to be written to the memory cell array 310, transmission of the read data from the memory cell array 310, and transmission and reception of control data.

The memory cell array 310 is a memory cell array configured with a plurality of memory cells, and the plurality of memory cells storing any value of binary values for each bit are arranged two-dimensionally (in a matrix). A unit of a request from the memory controller 200 for accessing the memory cell array 310 is a physical page unit. The physical page address is allocated to the physical page. The memory cell array 310 is an example of a memory cell array of the claims.

The row control unit 311 specifies a row address of the memory cell array 310 to perform access control, according to instruction from the request processing unit 360. The column control unit 312 specifies a column address of the memory cell array 310 to perform access control, according to instruction from the request processing unit 360. The plate control unit 320 controls a plate voltage for causing a cell current to flow to the memory cells of the memory cell array 310.

The writing control unit 331 executes control for performing writing to the memory cell array 310. The reading control unit 332 executes control for performing reading-out from the memory cell array 310. The refreshing control unit 333 executes control for performing refreshing with respect to the memory cell array 310.

The buffer 340 is a storage area of a buffer for retaining data necessary for processing each request. A configuration of the buffer 340 will be described later.

The verification processing unit 350 verifies whether or not data is correctly written in the memory cell array 310.

The request processing unit 360 is for processing a request from the memory controller 200. When the request from the memory controller 200 is a request for writing, the request processing unit 360 instructs the writing control unit 331 to perform control. In addition, when the request from the memory controller 200 is a request for reading, the request processing unit 360 instructs the reading control unit 332 to perform control. Further, when the request from the memory controller 200 is a request for refreshing, the request processing unit 360 instructs the refreshing control unit 333 to perform control.

Figure 3:
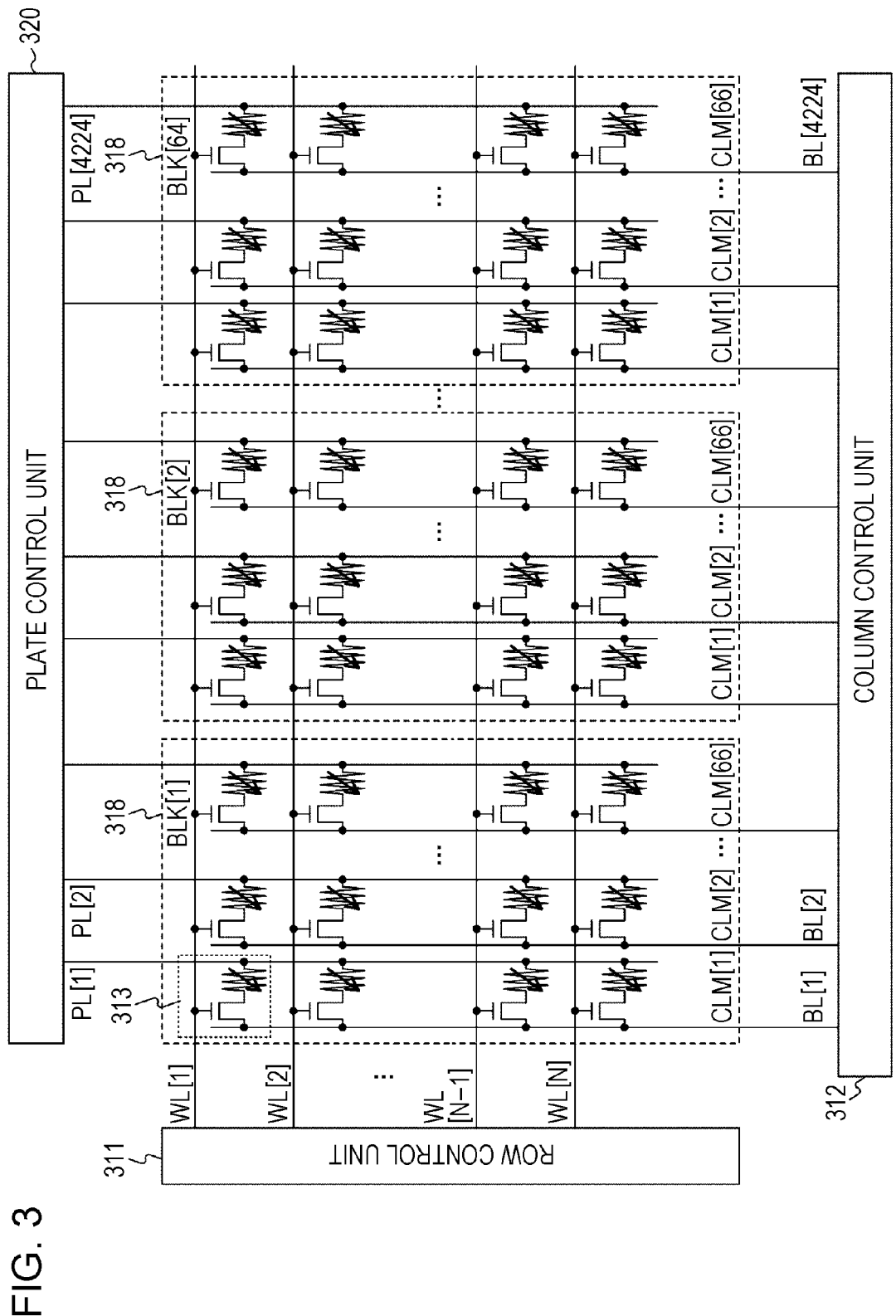
FIG. 3 is a diagram showing an example of a structure of a memory cell array according to an embodiment of the present application.

FIG. 3 is a diagram showing an example of a structure of the memory cell array 310 according to the embodiment of the present application. In the memory cell array 310, memory cells 313 are disposed in a matrix to have N rows (N is an integer equal to or larger than 2) in a row direction and 4224 columns in a column direction. Each of the memory cells 313 is connected to a word line WL, a bit line BL, and a plate line PL. In the drawing, N word lines WL are referred to as WL[1] to WL[N], 4224 bit lines BL are referred to as BL[1] to BL[4224], and 4224 plate lines PL are referred to as PL[1] to PL[4224]. The word lines WL are connected to the row control unit 311, and the bit lines BL are connected to the column control unit 312.

In this example, the memory cells of the memory cell array 310 in the row direction are divided into 64 blocks BLK318. Accordingly, each of the blocks BLK318 is configured with memory cells with N rows and 66 columns. In the drawing, 64 blocks BLK318 are referred to as BLK[1] to BLK[64]. Each of the blocks BLK318 is connected to 66 bit lines BL. 66 bit lines BL are referred to as column lines CLM[1] to CLM[66] in the block BLK318.

An array of 4224 memory cells connected to the same word line WL is referred to as a physical page. The memory controller 200 accesses the memory 300 using the physical page as a unit. A unique physical page address is assigned to a physical page.

An array configured with 64 memory cells selected one by one from each of 64 blocks BLK318 is referred to as a group. Herein, the number of memory cells belonging to one group is determined based on the current allowed in the memory cell array 310. Among 4224 memory cells connected to one word line WL, an array of the memory cells connected to the CLM[1] is referred to as a first group and an array of the memory cells connected to the CLM[2] is referred to as a second group. Hereinafter, an array of the memory cells connected to the CLM[66] is referred to as a $66^{th}$ group.

The row control unit 311 selects the word line WL designated based on the physical page address input from the request processing unit 360 and drives the word line with a predetermined period and a predetermined voltage. The voltage of the word line WL is a voltage for setting the memory cells connected to the word line WL in a writing, reading, or refreshing state. This voltage is referred to as a word line voltage and is at a high level and is active. The row control unit 311 controls applying timing, duration, and an applied voltage of a pulse having a crest value of the word line voltage.

The column control unit 312 includes a sense amplifier for reading out a potential of the bit line BL. Accordingly, it is possible to collectively read out the data of 4224 bits (528 bits).

The plate control unit 320 controls a plate voltage for causing a cell current to flow to the memory cells of the memory cell array 310. A direction of the memory cell current is determined by a voltage difference between this plate voltage and the voltage of the bit line BL. Accordingly, the plate control unit 320 controls a magnitude of the plate voltage with respect to the bit line voltage, and controls a direction of the voltage application so as to be reversed in the setting time and the resetting time. The direction of the voltage applied in the reading time is controlled so as to be the same direction as the direction of the voltage applied in the resetting time.

Figure 4:
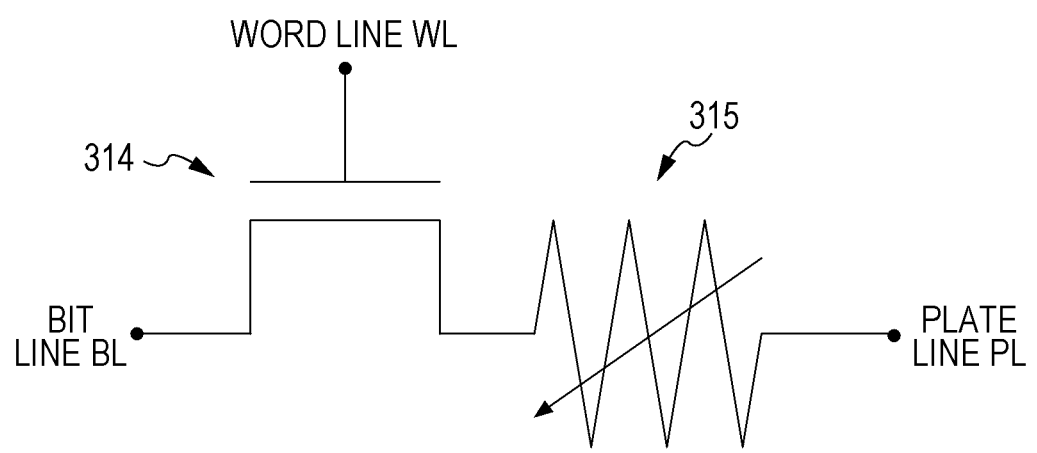
FIG. 4 is a diagram showing a circuit example of a memory cell according to an embodiment of the present application.

FIG. 4 is a diagram showing a circuit example of the memory cell 313 according to the embodiment of the present application. Herein, a variable resistance element is assumed as the memory cell 313, and is configured with one access transistor 314 and one variable cell resistance 315. One end of the variable cell resistance 315 is connected to the plate line PL and the other end thereof is connected to a source terminal of the access transistor 314. A drain terminal of the access transistor 314 is connected to the bit line BL, and a gate terminal thereof is connected to the word line WL.

The variable cell resistance 315 is in a low resistance state (LRS) when the voltage of the plate line PL is set to be higher by a predetermined magnitude than that of the bit line BL. This operation of setting the variable cell resistance 315 to the low resistance state is referred to as a setting operation. On the other hand, when the voltage of the bit line BL is increased to be higher than that of the plate line PL, the variable cell resistance 315 is in a high resistance state (HRS). This operation of setting the variable cell resistance 315 to the high resistance state is referred to as a resetting operation.

A memory which can store one bit by one memory cell is realized by reversibly changing the resistance state between the low resistance state and the high resistance state. The data is retained even after the voltage is stopped being applied, and accordingly the memory functions as a non-volatile memory. Hereinafter, an example in which data read out from the cell in the low resistance state is set as "1" and data read out from the cell in the high resistance state is set as "0" will be described, but these may be reversed.

Resistance State of Memory

Figure 5:
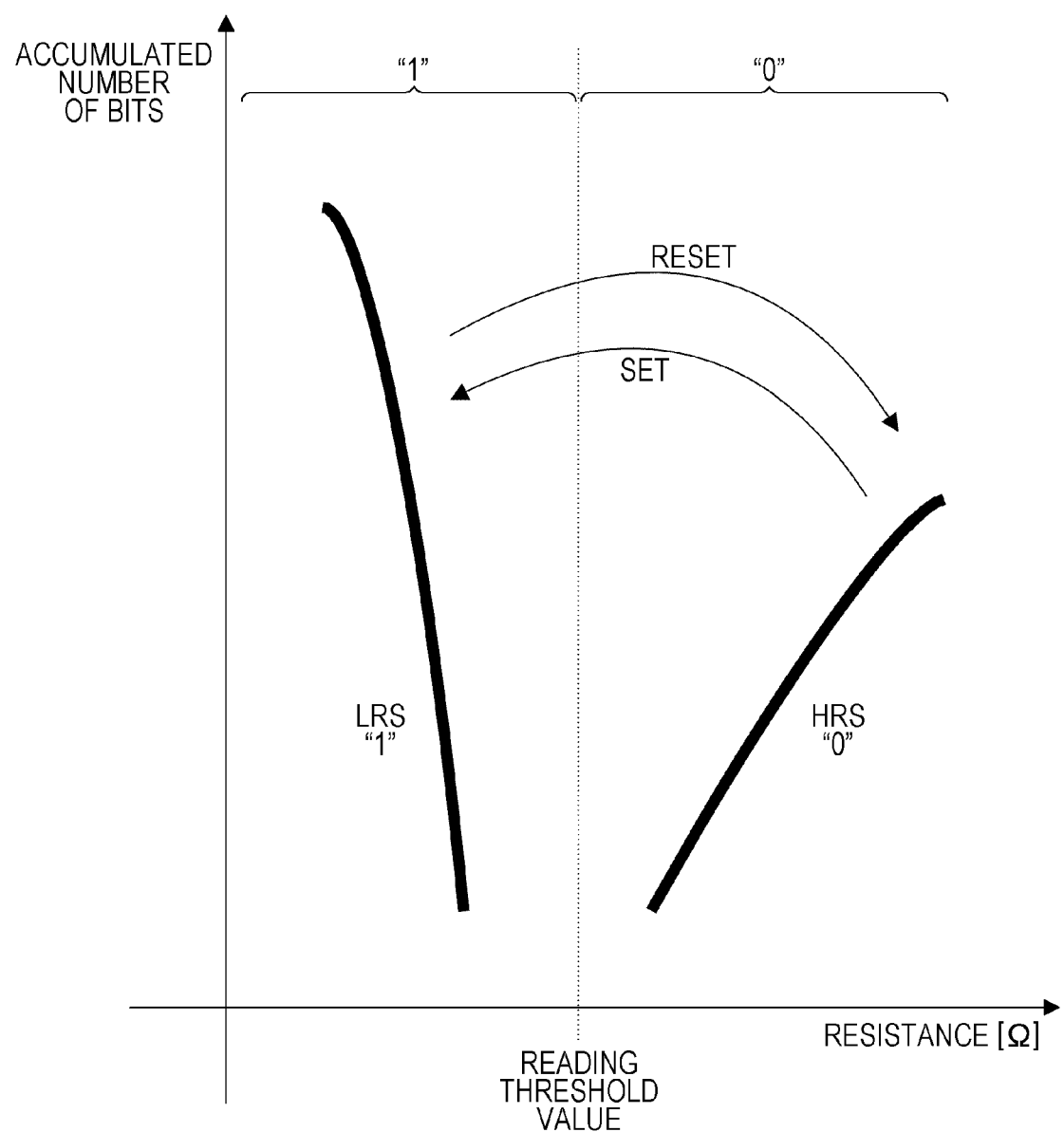
FIG. 5 is a diagram showing a resistance distribution in a normal state of a memory cell according to an embodiment of the present application.

FIG. 5 is a diagram showing a resistance distribution in a normal state of the memory cell 313 according to the embodiment of the present application. The memory cell 313 transitions to the low resistance state (LRS) by the setting operation and transitions to the high resistance state (HRS) by the resetting operation. When reading out the data from the memory cell array 310, the resistance state is determined using a reference resistance value shown by a reading threshold value as a reference.

Figure 6:
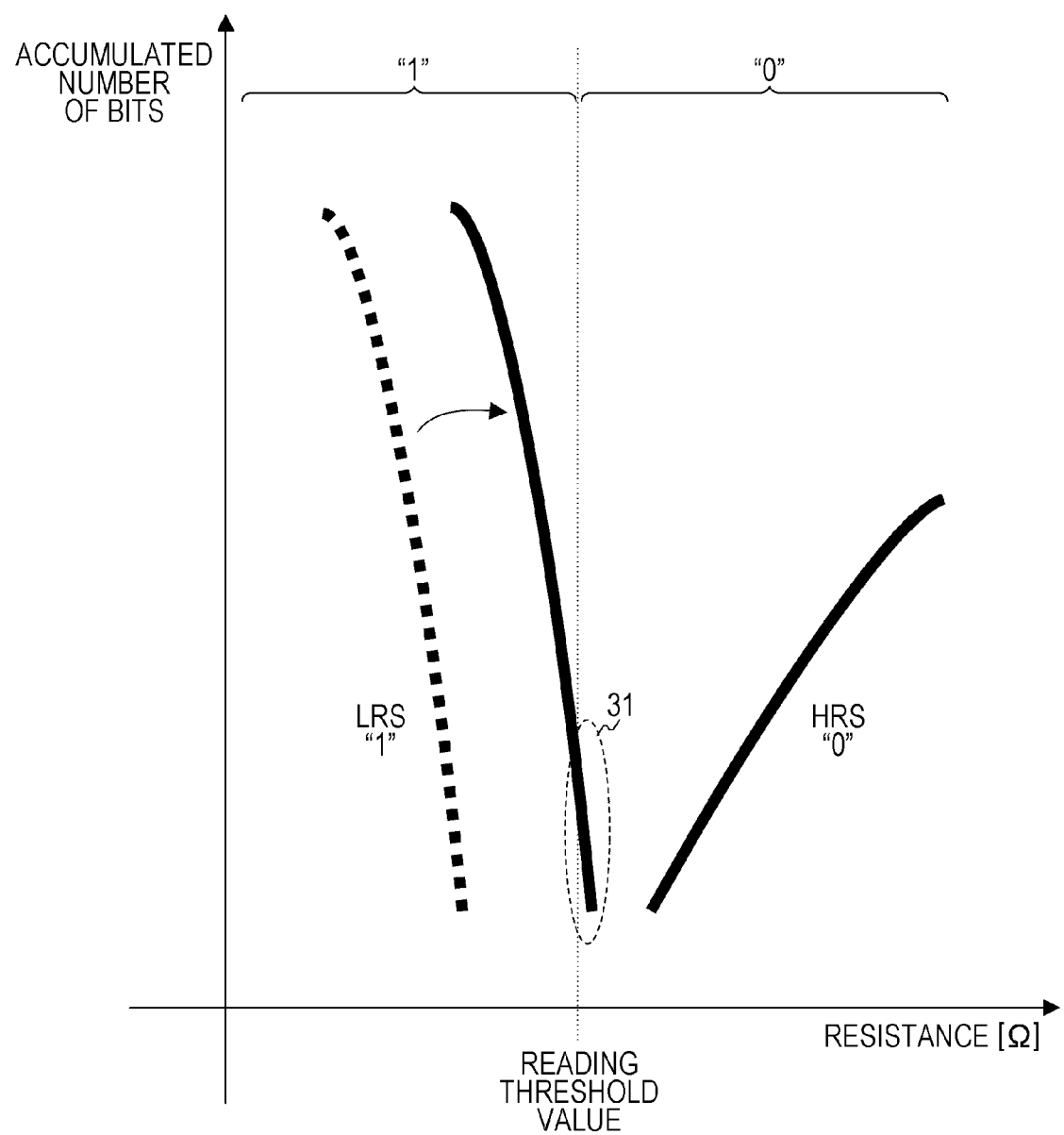
FIG. 6 is a diagram showing a changed resistance distribution of a memory cell according to an embodiment of the present application.

FIG. 6 is a diagram showing a changed resistance distribution of the memory cell 313 according to the embodiment of the present application. This drawing is an example in which the state of the memory cell which is transitioned to the LRS by the setting operation is read out as the HRS. In a resistance change memory, a distribution of the memory cell may change due to secular variation or stress caused by the voltage applied to the memory cell in the reading time, and erroneous data is read out, in some cases. In this example, the resistance state supposed to be transitioned to the LRS is changed to the high resistance side, and a some of the resistance state 31 may be interpreted as the HRS when the reading threshold value is set as a reference. As described above, since the voltage which is in the same direction as that of the voltage applied in the resetting operation is applied in the reading time, the state of the memory cell in the LRS is easily degraded by the reading.

Therefore, in the embodiment, it is assumed that the degraded resistance state is rewritten as a correct resistance state by the refreshing process. In addition, a rapid processing of the storage system is realized, by rapidly processing this refreshing process. In this embodiment, it is assumed that the voltage applied in the reading time is in the same direction as that of the voltage applied in the resetting operation, but the embodiment can be applied based on the same consideration, also when the voltage applied in the reading time is in the same direction as that of the voltage applied in the setting operation.

Data Structure

Figure 7:
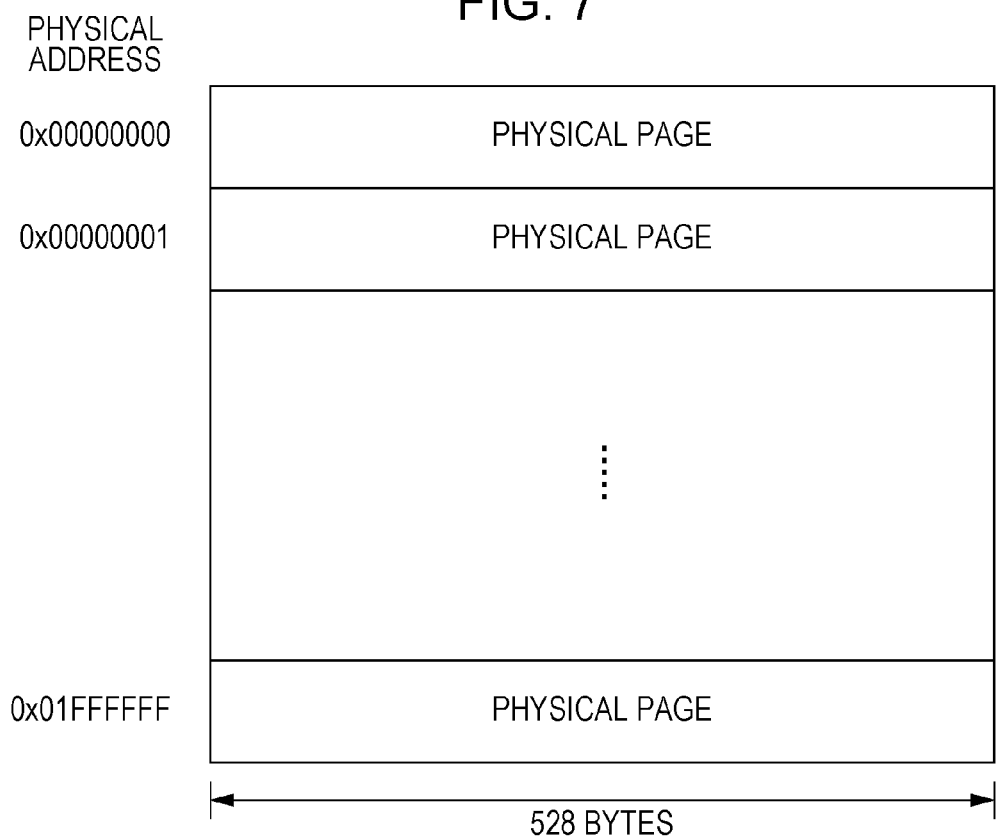
FIG. 7 is a diagram showing an example of a structure of data stored in a memory cell array according to an embodiment of the present application.

FIG. 7 is a diagram showing an example of a structure of data stored in the memory cell array 310 according to the embodiment of the present application.

As described above, in the memory cell array 310, the memory cells 313 are disposed in a matrix to have N rows in the row direction and 4224 columns in the column direction. Herein, as the physical addresses, "0x00000000" to "0x01FFFFFF" are allocated to N addresses. "0x" shows that the number subsequent thereto is hexadecimal, and thus N is "33554432" in a decimal number. That is, the memory cell array 310 is configured with 33554432 physical pages and is specified by the physical addresses "0" to "33554431". At that time, each physical page has 528 bytes (4224 bits).

Figure 8:
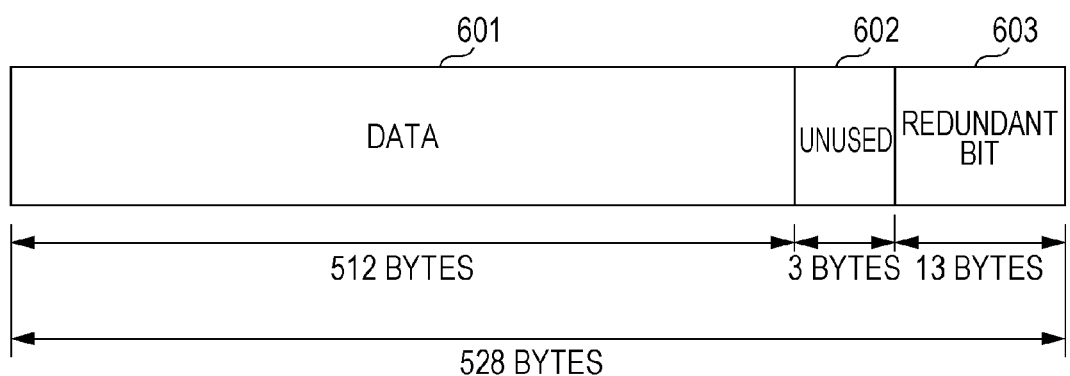
FIG. 8 is a diagram showing an example of a structure of a physical page stored in a memory cell array according to an embodiment of the present application.

FIG. 8 is a diagram showing an example of a structure of the physical page stored in the memory cell array 310 according to the first embodiment of the present application.

The physical page is configured with data 601 having 512 bytes (4096 bits), an unused area 602 having 3 bytes, and a redundant bit 603 having 13 bytes (104 bits). The redundant bit 603 is an error correction code for correcting an error of the data 601 and is assumed to have correction capability of 8 bits.

Type of Buffer

Figure 9:
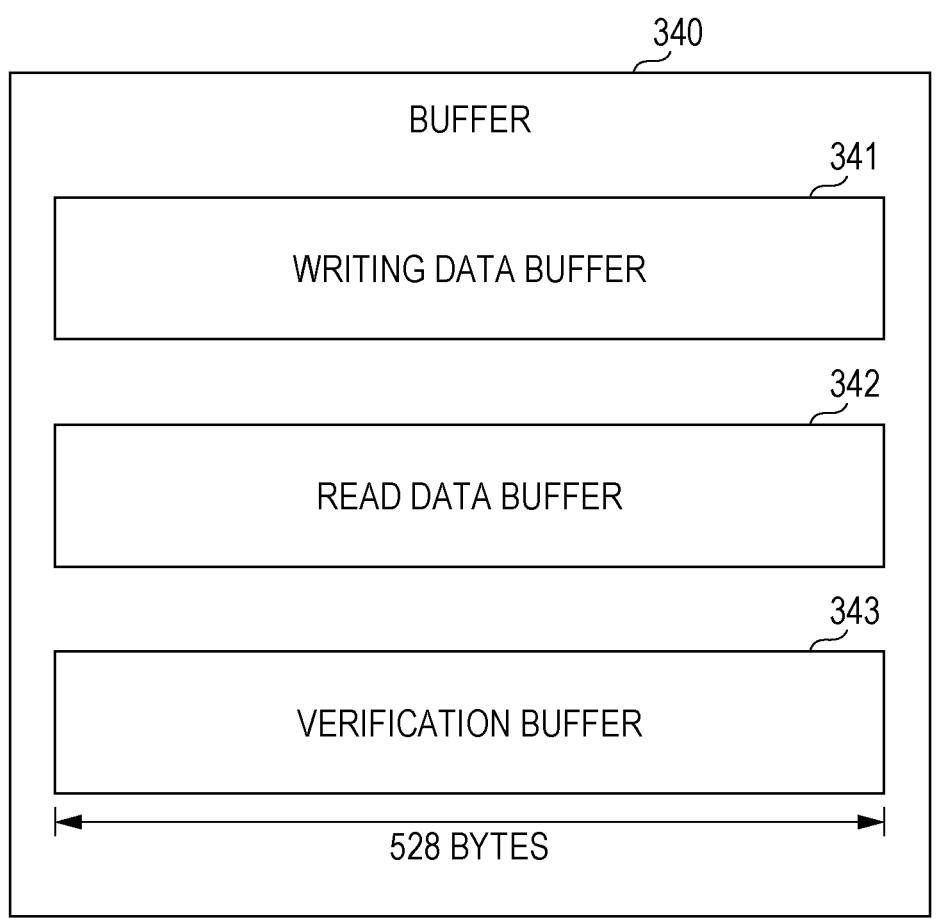
FIG. 9 is a diagram showing an example of each buffer retained in a buffer according to an embodiment of the present application.

FIG. 9 is a diagram showing an example of each buffer retained in the buffer 340 according to the embodiment of the present application. In this example, it is assumed that a writing data buffer 341, a read data buffer 342, and a verification buffer 343 are provided in the buffer 340.

The writing data buffer 341 is a buffer for retaining data to be written which is a writing target with respect to the memory cell array 310. The read data buffer 342 is a buffer for retaining read data which is read from the memory cell array 310. The verification buffer 343 is a buffer for retaining a verified result obtained by a verification processing unit 350. In addition, the verification buffer 343 is also used for specifying a bit to be a setting target or a reset target. Each buffer has a 528-byte width in the same manner as the physical page.

Figure 10:
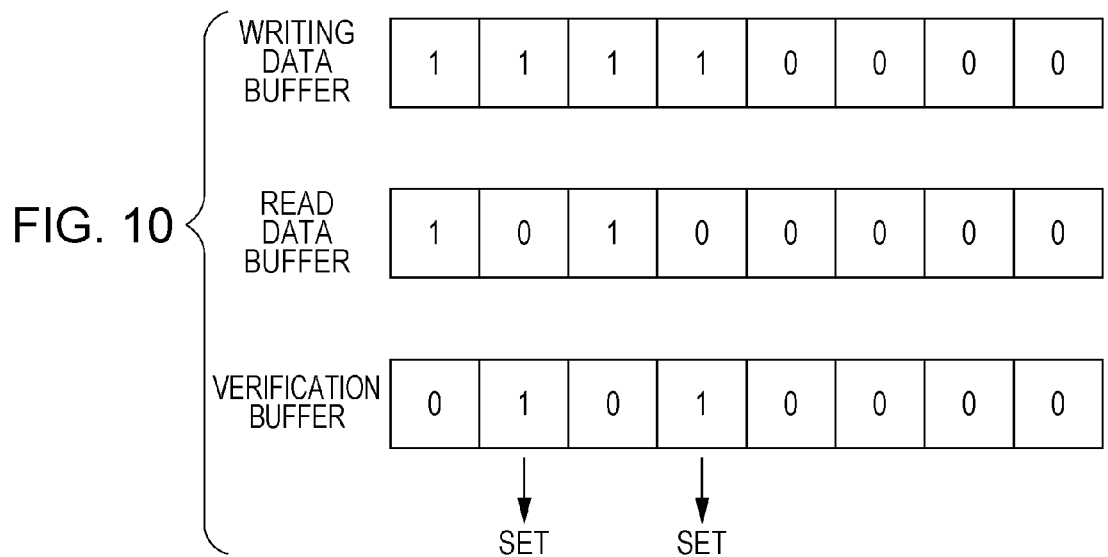
FIG. 10 is a diagram showing a specific example retained in a buffer according to an embodiment of the present application.

FIG. 10 is a diagram showing a specific example retained in the buffer 340 according to an embodiment of the present application. In examples hereinafter, only the corresponding portion having 8 bits will be shown as a part of 4224 bits of each buffer.

The writing data buffer 341 retains "11110000" as the data to be written, and the read data buffer 342 retains "10100000" as the pre-read data. Herein, it is assumed that the memory cell 313 to be set is specified and the result thereof is retained in the verification buffer 343. That is, the memory cell in which data already written is "0" and data to be written is "1" is specified as a memory cell to be set from "0" to "1". In this example, the verification buffer 343 retains "01010000", and the second and fourth memory cells are specified as the memory cells to be set.

Figure 11:
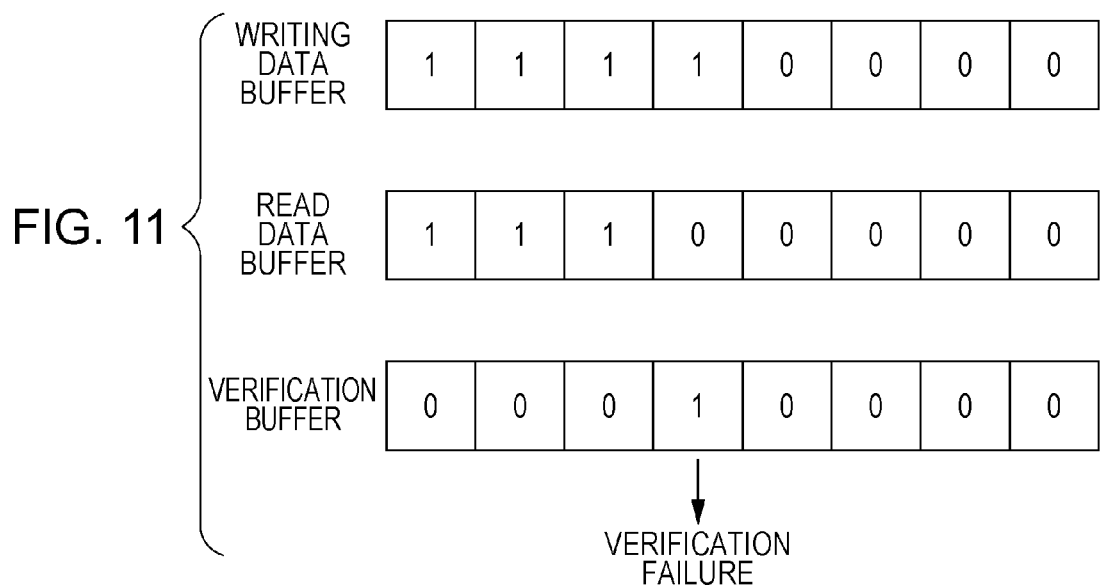
FIG. 11 is a diagram showing a specific example retained in a buffer according to an embodiment of the present application.

FIG. 11 is a diagram showing a specific example retained in the buffer 340 according to the embodiment of the present application.

The writing data buffer 341 retains "11110000" as the data to be written, and the read data buffer 342 retains "11100000" as the data read for verification. Herein, it is assumed that the verification is performed by comparing the retained content of the writing data buffer 341 and the retained content of the read data buffer 342 to each other, and the result thereof is retained in the verification buffer 343. That is, the memory cell in which the original data to be written does not coincide with the data actually written, is a memory cell with failure in writing. In this example, the verification buffer 343 retains "00010000", and the fourth memory cell shows the failure in writing as the result of the verification.

Figure 12:
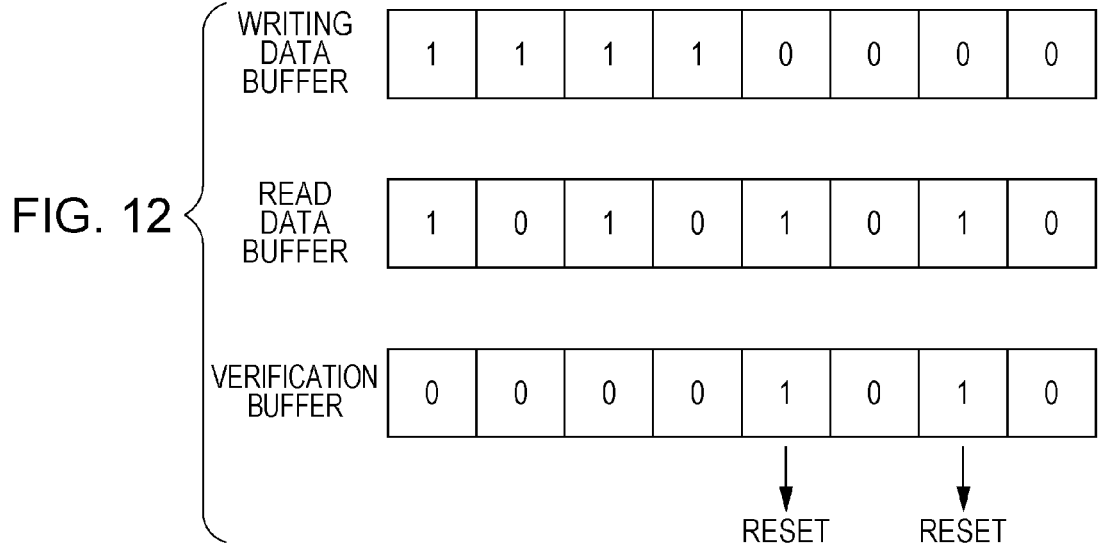
FIG. 12 is a diagram showing a specific example retained in a buffer according to an embodiment of the present application.
Figure 13:
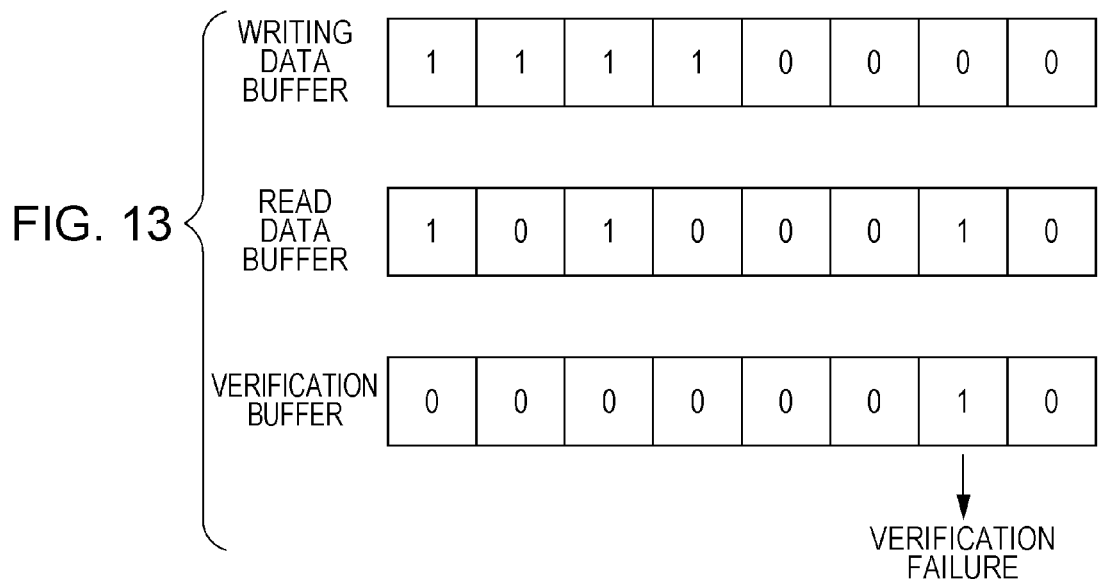
FIG. 13 is a diagram showing a specific example retained in a buffer according to an embodiment of the present application.

FIG. 12 is a diagram showing a specific example retained in the buffer 340 according to the embodiment of the present application.

The writing data buffer 341 retains "11110000" as the data to be written, and the read data buffer 342 retains "10101010" as the pre-read data. Herein, it is assumed that the memory cell 313 to be set is specified and the result thereof is retained in the verification buffer 343. That is, the memory cell in which data already written is "1" and data to be written is "0" is specified as a memory cell to be reset from "1" to "0". In this example, the verification buffer 343 retains "00001010", and the fifth and seventh memory cells are specified as the memory cells to be reset.

FIG. 11 is a diagram showing a specific example retained in the buffer 340 according to the embodiment of the present application.

The writing data buffer 341 retains "11110000" as the data to be written, and the read data buffer 342 retains "10100010" as the data read for verification. Herein, it is assumed that the verification is performed by comparing the retained content of the writing data buffer 341 and the retained content of the read data buffer 342 to each other, and the result thereof is retained in the verification buffer 343. That is, the memory cell in which the original data to be written does not coincide with the data actually written, is a memory cell with failure in writing. In this example, the verification buffer 343 retains "00000010", and the seventh memory cell shows the failure in writing as the result of the verification.

Operation of Information Processing System

Figure 14:
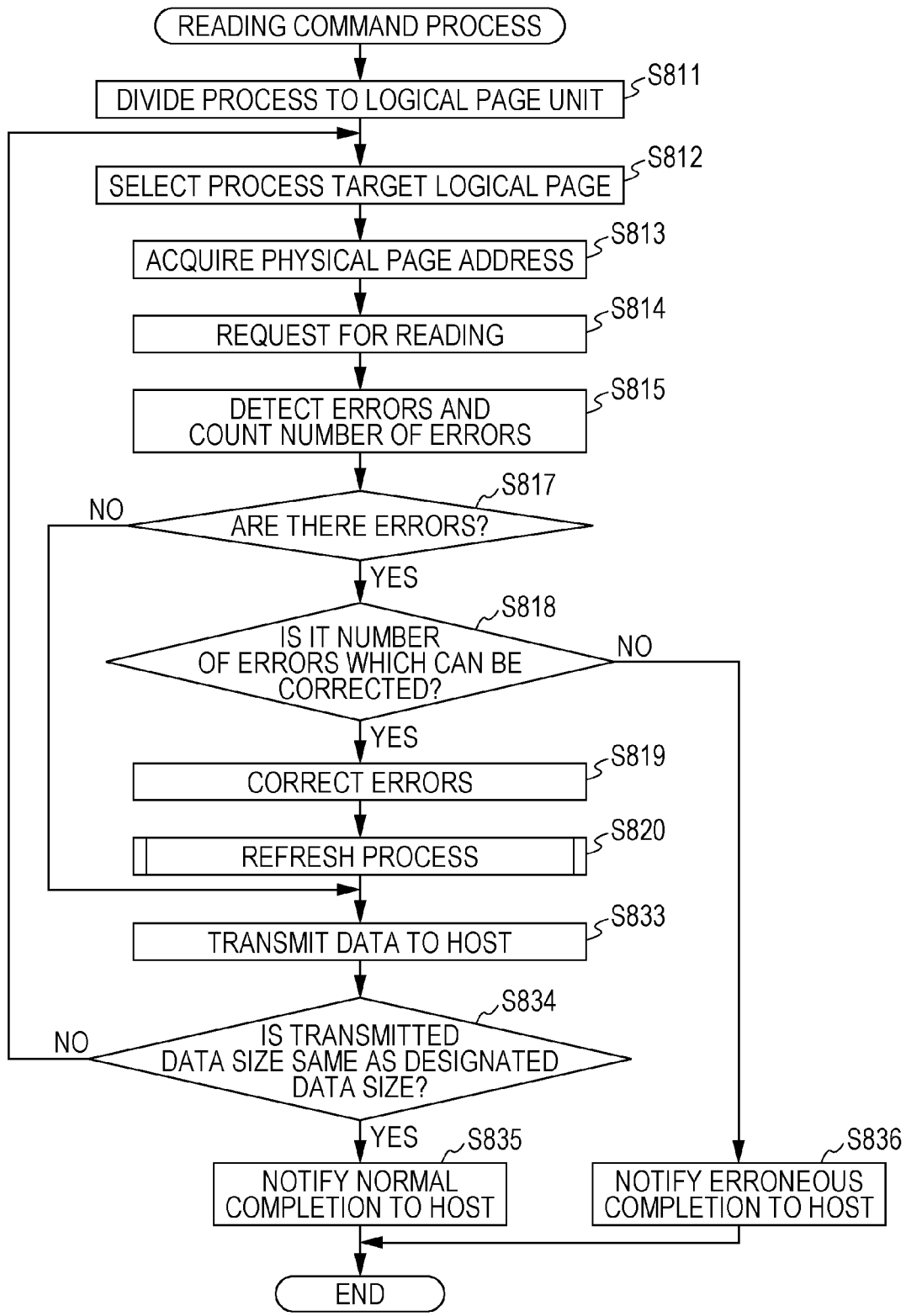
FIG. 14 is a flowchart showing an example of a reading command process procedure of a memory controller according to a first embodiment of the present application.

FIG. 14 is a flowchart showing an example of a reading command process procedure of the memory controller 200 according to the first embodiment of the present application. When a command is received from the host computer 100, the processor 210 of the memory controller 200 interprets the type of the command and performs the corresponding process. Herein, a procedure when the command is the reading command is shown.

The processor 210 divides the process into units of the logical addresses, based on a head logical address and a data size of a reading target received by the host interface 201 (Step S811). The logical address executed in the single process is 1 logical address. For example, when "0" is designated as the head address of the reading target and "1" is designated as the data size, the single process is performed. When "0" is designated as the head logical address of the reading target and "2" is designated as the data size, the process is divided into two processes.

The processor 210 determines the logical address to be the reading target (Step S812). The logical address to be the target is determined in the order from the head logical address of the reading target. When "0" is designated as the head logical address of the reading target and "2" is designated as the data size, the logical address to be initially processed is determined as "0". The logical address to be next target is determined as "1".

The processor 210 converts the logical address determined as the reading target into the physical address by using the address conversion table retained in the RAM 220 (Step S813).

The processor 210 designates the converted physical address and makes a request for reading with respect to the memory 300 (Step S814). The data to be read out from the memory 300 has 4224 bits (528 bytes) including the unused area and the redundant bit.

The data read out from the memory 300 is transmitted to the ECC processing unit 240 and is retained in the ECC processing unit 240. The ECC processing unit 240 performs error detection from the data having 528 bytes (Step S815). When errors are detected, the ECC processing unit 240 counts the number of all erroneous bits (Eall) and the number of bits (Ehrs) obtained by reading out the bits supposed to be in the LRS ("1") as the bits in the HRS ("0") due to the degradation among the bits detected as the errors. That is, this number of bits Ehrs shows the number of errors in the degraded low resistance state. When errors are not detected, the number of all erroneous bits (Eall) is set as "0", and the process proceeds to a process in Step S833 (Step S817: No).

When errors are detected (Step S817: Yes), if it is not the number of errors which can be corrected (Step S818: No), error completion of the command is notified with respect to the host computer 100 (Step S836). In this example, it is assumed that the number of errors which can be corrected as described above is up to "8". If the number thereof is the number of errors which can be corrected (Step S818: Yes), the ECC processing unit 240 performs error correction of the retained data having 528 bytes (Step S819) and performs the refreshing process (Step S820). Details of the refreshing process will be described later.

The data 601 having 512 bytes among the data having 528 bytes is transmitted to the host computer 100 from the ECC processing unit 240 through the host interface 201 (Step S833). When the error correction is performed in Step S819, the data to be transmitted is the corrected data.

The processor 210 determines whether or not the total of the data sizes transmitted to the host computer 100 in this reading command process coincides with the data size designated by this reading command (Step S834). When the total of transmitted data sizes is smaller than the designated data size (Step S834: No), the processes in Step S812 and subsequent steps are repeated. When the total of transmitted data sizes reaches the designated data size (Step S834: Yes), proper completion of the command is notified with respect to the host computer 100 (Step S835).

Figure 15:
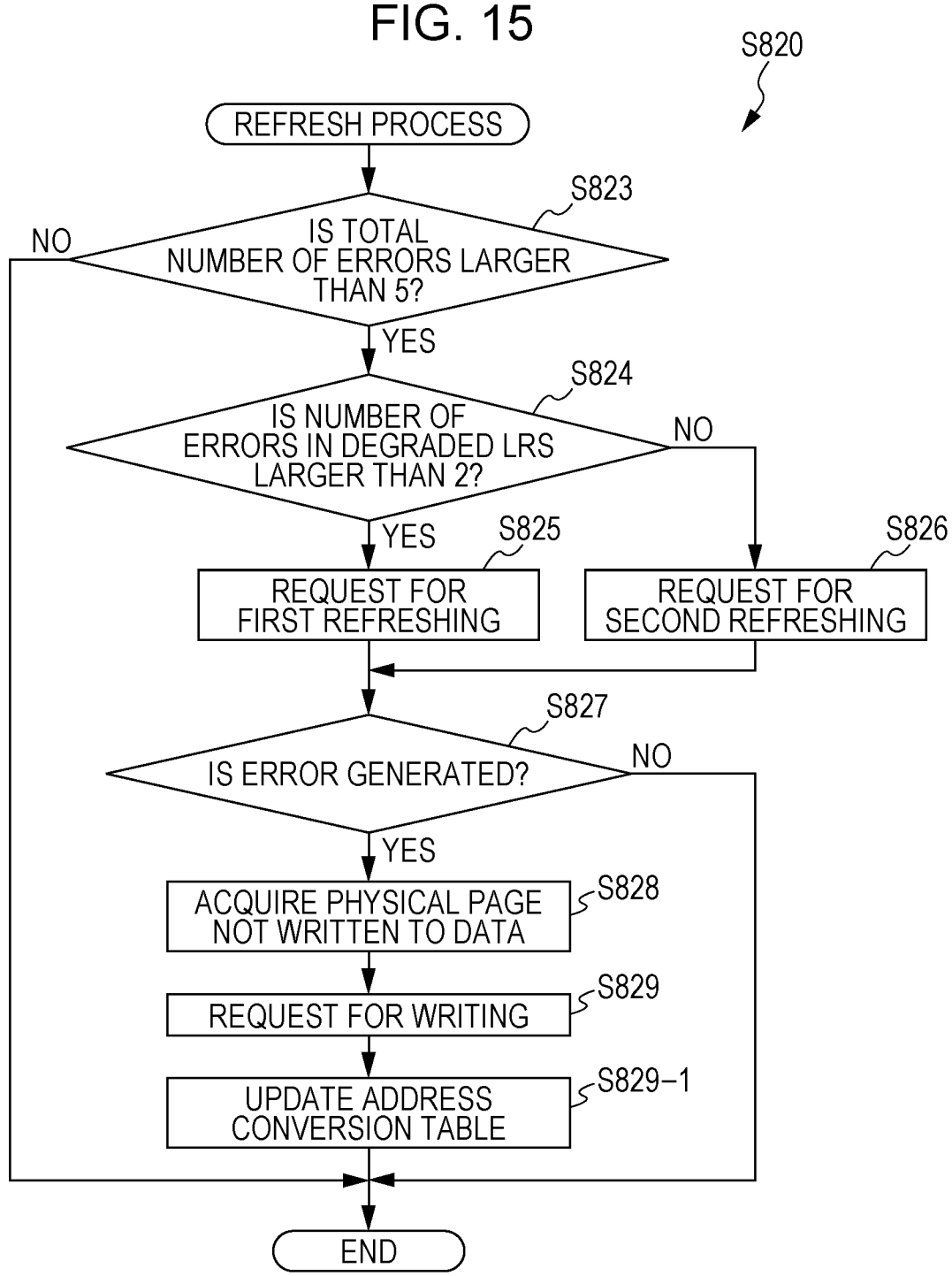
FIG. 15 is a flowchart showing an example of a process procedure of a refreshing process (Step S820) of a memory controller according to a first embodiment of the present application.

FIG. 15 is a flowchart showing an example of a process procedure of the refreshing process (Step S820) of the memory controller 200 according to the first embodiment of the present application.

The processor 210 determines whether or not the number of errors Eall counted in Step S815, that is, the number of all erroneous bits is greater than 5 bits (Step S823). When the number of errors is equal to or smaller than 5, the refreshing process ends (Step S823: No).

The processor 210 determines whether or not the number of errors Ehrs counted in Step S815, that is, the number of bits read out as "0" due to the degradation among the bits detected as errors, is greater than 2 bits (Step S824). As shown in FIG. 6, the number of errors Ehrs is the number of errors generated when the bits supposed to be in the IRS are determined as the bits in the HRS due to the degradation. When the number of detected errors Ehrs is greater than 2 bits (Step S824: Yes), the processor 210 makes a request for first refreshing of the physical addresses in which the errors are generated with respect to the memory 300 (Step S825). On the other hand, when the number of detected errors Ehrs is equal to or smaller than 2 bits (Step S824: No), the processor 210 makes a request for second refreshing of the physical addresses in which the errors are generated with respect to the memory 300 (Step S826).

The request for first refreshing is a request for a refreshing process of performing only the setting operation from the setting operation and the resetting operation. The request for second refreshing is a request for a refreshing process of performing both the setting operation and the resetting operation. Therefore, when the number of errors Ehrs obtained by determining the bits supposed to be in LRS as the bits in the HRS due to the degradation is greater than 2 bits, only the setting operation is executed as the refreshing process. On the other hand, when the number of errors Ehrs is equal to or smaller than 2 bits, both the setting operation and the resetting operation are executed as the refreshing process. When making a request for the first refreshing and the second refreshing, the processor 210 transmits the data having 528 bytes retained in the ECC processing unit 240 to the memory 300. In addition, in the requests for the first refreshing and the second refreshing, the physical address acquired in Step S813 is designated.

The processor 210 determines whether or not the errors are generated in the process with respect to the request for the first refreshing or the request for the second refreshing (Step S827). When the errors are not generated (Step S827: No), the refreshing process ends. When the errors are generated (Step S827: Yes), the processor 210 acquires the physical address of the memory 300 which is not allocated to the logical address (Step S828). The acquired physical address is designated to make a request to the memory 300 for writing, and the writing of the data is performed (Step S829). The data to be written is data having 528 bytes subjected to the error correction and retained in the ECC processing unit 240. The value of the physical address corresponding to the logical address subjected to the refreshing process in the address conversion table is updated to the value of the written physical address (Step S829-1).

Figure 16:
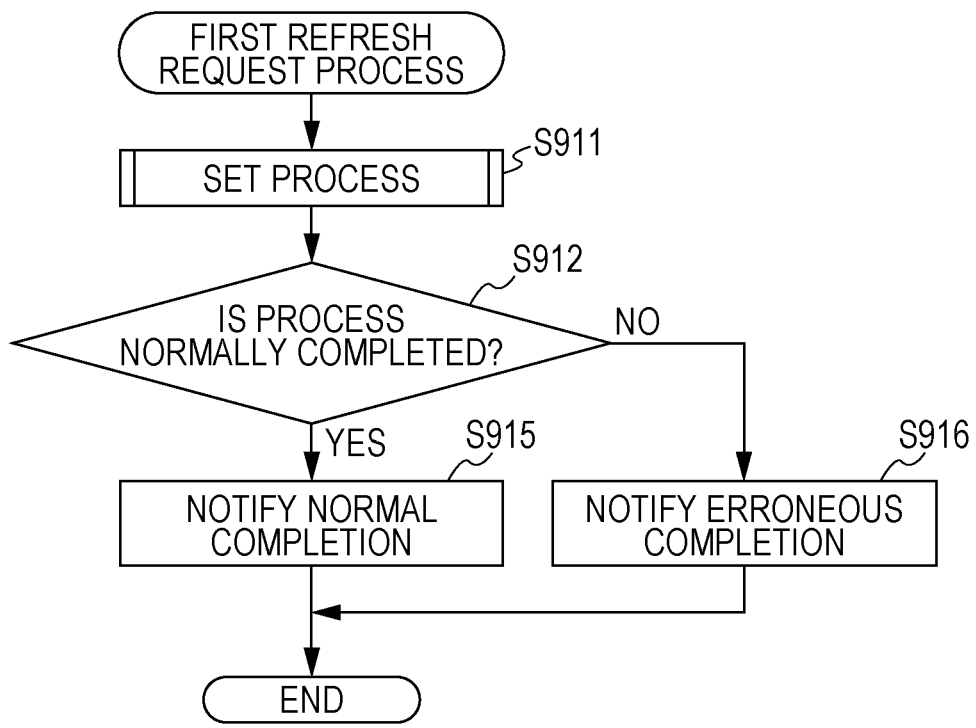
FIG. 16 is a flowchart showing an example of a process procedure of a first refreshing request process of a memory according to an embodiment of the present application.

FIG. 16 is a flowchart showing an example of a process procedure of a first refreshing request process of the memory 300 according to the embodiment of the present application. This first refreshing request process is started in response to the request in Step S825 or the like.

When the request for the first refreshing and the physical address are received from the memory controller 200 through the control interface 309, the request processing unit 360 starts the first refreshing request process. The data having 528 bytes necessary for the first refreshing request process is transmitted from the control interface 309 to the writing data buffer 341 and is retained therein. The physical address is transmitted from the control interface 309 to the request processing unit 360 and is retained therein.

The request processing unit 360 executes the setting process (Step S911). Details of the setting process will be described later.

After completing the setting process, the request processing unit 360 determines whether or not this setting process is properly completed (Step S912). When the process is properly completed (Step S912: Yes), the request processing unit 360 notifies the proper completion of the first refreshing request process, to the memory controller 200 through the control interface 309 (Step S915). On the other hand, when the process is erroneously completed (Step S912: No), the request processing unit 360 notifies the erroneous completion of the first refreshing request process, to the memory controller 200 through the control interface 309 (Step S916). After that, the request processing unit 360 completes the first refreshing request process.

Figure 17:
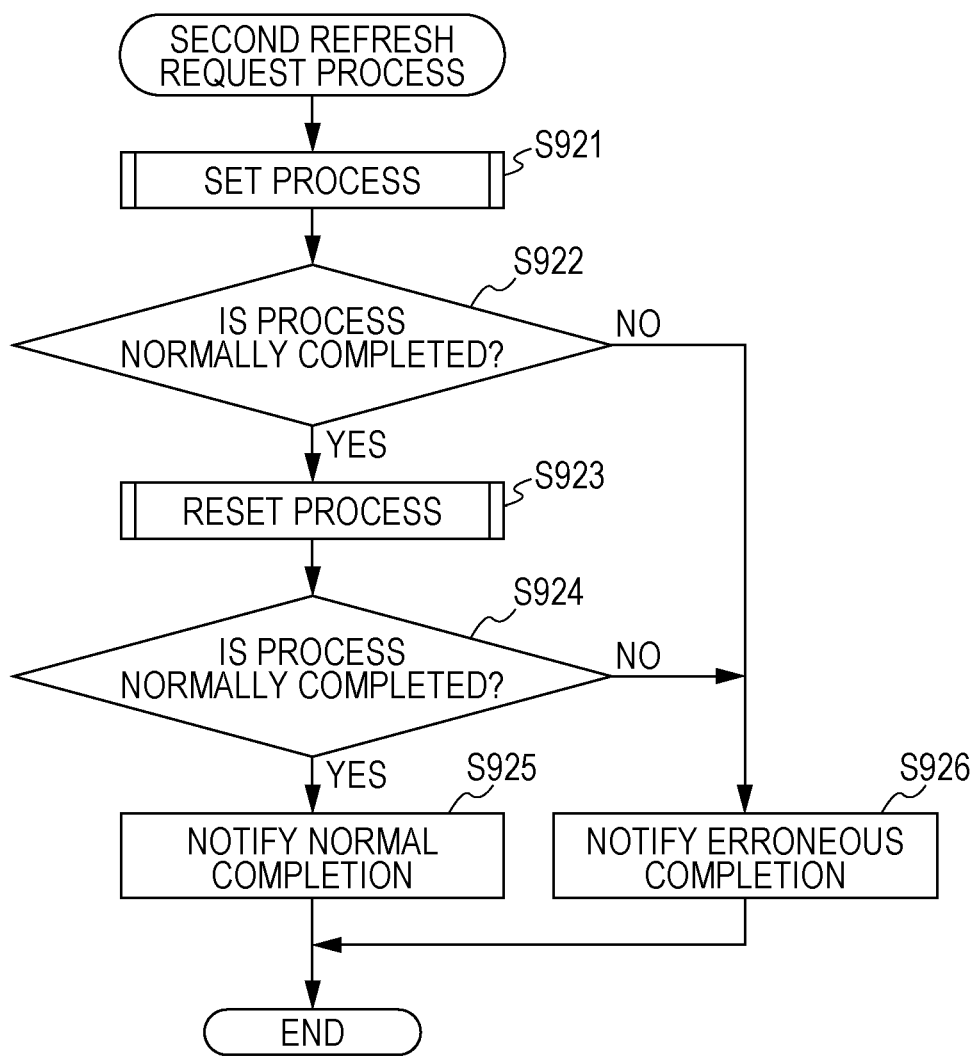
FIG. 17 is a flowchart showing an example of a process procedure of a second refreshing request process of a memory according to an embodiment of the present application.

FIG. 17 is a flowchart showing an example of a process procedure of a second refreshing request process of the memory 300 according to the embodiment of the present application. The second refreshing request process is started in response to the request in Step S826 or the like.

When the request for the second refreshing and the physical address are received from the memory controller 200 through the control interface 309, the request processing unit 360 starts the second refreshing request process. The data having 528 bytes necessary for the second refreshing request process is transmitted from the control interface 309 to the writing data buffer 341 and is retained therein. The physical address is transmitted from the control interface 309 to the request processing unit 360 and is retained therein.

The request processing unit 360 executes the setting process (Step S921). Details of the setting process will be described later.

After completing the setting process, the request processing unit 360 determines whether or not this setting process is properly completed (Step S922). When the process is erroneously completed (Step S922: No), the request processing unit 360 notifies the erroneous completion of the second refreshing request process, to the memory controller 200 through the control interface 309 (Step S926).

When the setting process is property completed (Step S922: Yes), the request processing unit 360 executes the resetting process (Step S923). Details of the resetting process will be described later.

After completing the resetting process, the request processing unit 360 determines whether or not this resetting process is properly completed (Step S924). When the process is properly completed (Step S924: Yes), the request processing unit 360 notifies the proper completion of the second refreshing request process, to the memory controller 200 through the control interface 309 (Step S925). On the other hand, when the process is erroneously completed (Step S924: No), the request processing unit 360 notifies the erroneous completion of the second refreshing request process, to the memory controller 200 through the control interface 309 (Step S926). After that, the request processing unit 360 completes the second refreshing request process.

Figure 18:
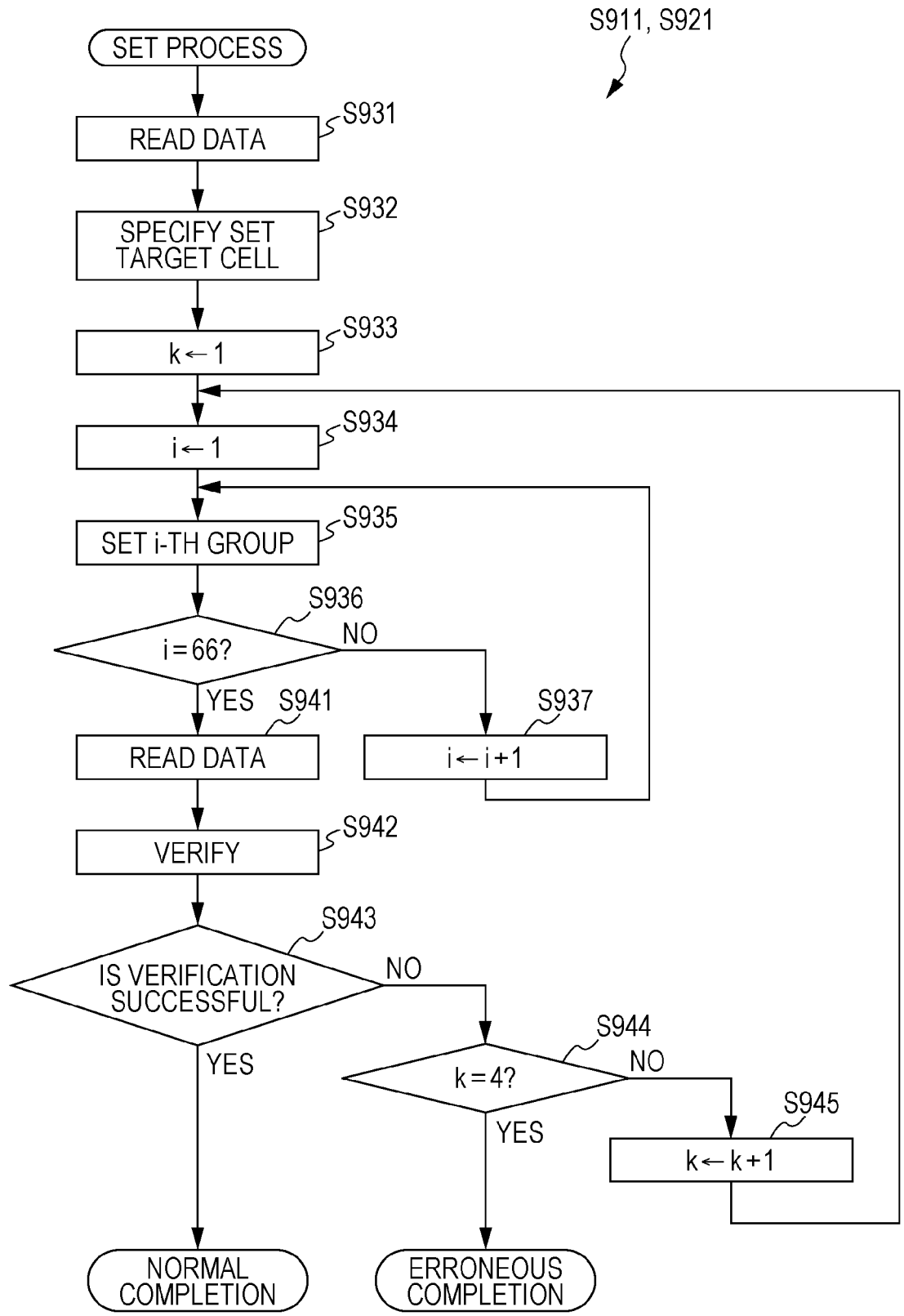
FIG. 18 is a flowchart showing an example of a process procedure of a setting process of a memory according to an embodiment of the present application.

FIG. 18 is a flowchart showing an example of a process procedure of the setting process of the memory 300 according to the embodiment of the present application. This setting process corresponds to the process in Step S911 or Step S921.

The request processing unit 360 supplies a control signal to the plate control unit 320, the row control unit 311, and the reading control unit 332, and reads out the data from the designated physical page address (Step S931). The read-out data is transmitted to the read data buffer 342 as pre-read data and is retained therein.

The request processing unit 360 compares the pre-read data retained in the read data buffer 342 and the data to be written retained in the writing data buffer 341 to each other in units of bits, and specifies the memory cell for execution of the setting process (Step S932). The memory cell for execution of the setting process is a memory cell in which the value of the data retained in the writing data buffer 341 is "1" and the value of the data retained in the read data buffer 342 is "0". This means that it is necessary for the state of the corresponding memory cell to be changed from "0" (high resistance state) to "1" (low resistance state). As information of the memory cell for execution of the setting process, the value of the bit corresponding to the memory cell for execution of the setting process is set to "1", the value of the bit corresponding to the cell not necessary for execution of the setting process is set to and the data is retained in the verification buffer 343.

The request processing unit 360 sets a value of a counter k for counting the number of times of repeated execution of setting and verification as "1" (Step S933).

The request processing unit 360 sets a value of a counter i for determining a group number for executing the setting process as "1" (Step S934).

The request processing unit 360 supplies the control signal to the plate control unit 320, the row control unit 311, and the writing control unit 331, and supplies specific information of the cell for executing the setting to the column control unit 312 from the verification buffer 343. Accordingly, a setting pulse is applied with respect to the memory cell array 310 and the setting operation is performed (Step S935). Herein, the memory cell to which the setting pulse is applied is a cell for executing the setting process among the memory cells belonging to the i-th group in the designated physical page address.

The request processing unit 360 determines whether or not the value of the counter i showing the group number subjected to the setting operation is "66" (Step S936). When the value of the counter i is not "66" (Step S936: No), "1" is added to the counter i (Step S937) and the processes in Step S935 and the subsequent steps are repeated. On the other hand, when the value of the counter i is "66", the setting operation for each group ends (Step S936: Yes).

The request processing unit 360 supplies the control signal to the plate control unit 320, the row control unit 311, and the reading control unit 332, and reads out the data from the physical page address to which the setting pulse is applied for the verification of the setting operation (Step S941). The read-out data is transmitted to the read data buffer 342 and is retained therein.

The request processing unit 360 supplies the control signal to the verification processing unit 350 and compares the data retained in the read data buffer 342 and the data to be written retained in the writing data buffer 341 in units of bits to execute the verification process (Step S942). The bit which is the target of the verification process is a bit in which the value of the data retained in the writing data buffer 341 shows "11". The bit in which the value of the data retained in the writing data buffer 341 is "1" and the value retained in the read data buffer 342 is "0" shows the failure in writing as the result of the verification. The bit in which the value of the data retained in the writing data buffer 341 is "1" and the value retained in the read data buffer 342 is "1" shows the success in writing as the result of the verification. As a result, the data in which the value of "11" is set to the bit with failure in writing, the value of "0" is set to the bit with success in writing, and the value of "0" is set to other bits, is retained in the verification buffer 343.

When all bits of the data retained in the verification buffer 343 show "0", the verification processing unit 350 notifies the success of all bits in writing as the result of the verification process (Step S943: Yes) to the request processing unit 360, and properly completes the physical page setting process.

Meanwhile, when any bit of the data retained in the verification buffer 343 shows "1", the result of the verification process shows that there is not success in writing with all bits (Step S943: No), and a retrying operation of the setting process is performed. At that time, when the value of the counter k is referred to and the value of the counter k is "4" (Step S944: Yes), the physical page setting process is erroneously completed without performing any more retrying operations. When the value of the counter k is not "4" (Step S944: No), "1" is added to the value of the counter k (Step S945) and the process in Step S934 and the subsequent steps are repeated.

Figure 19:
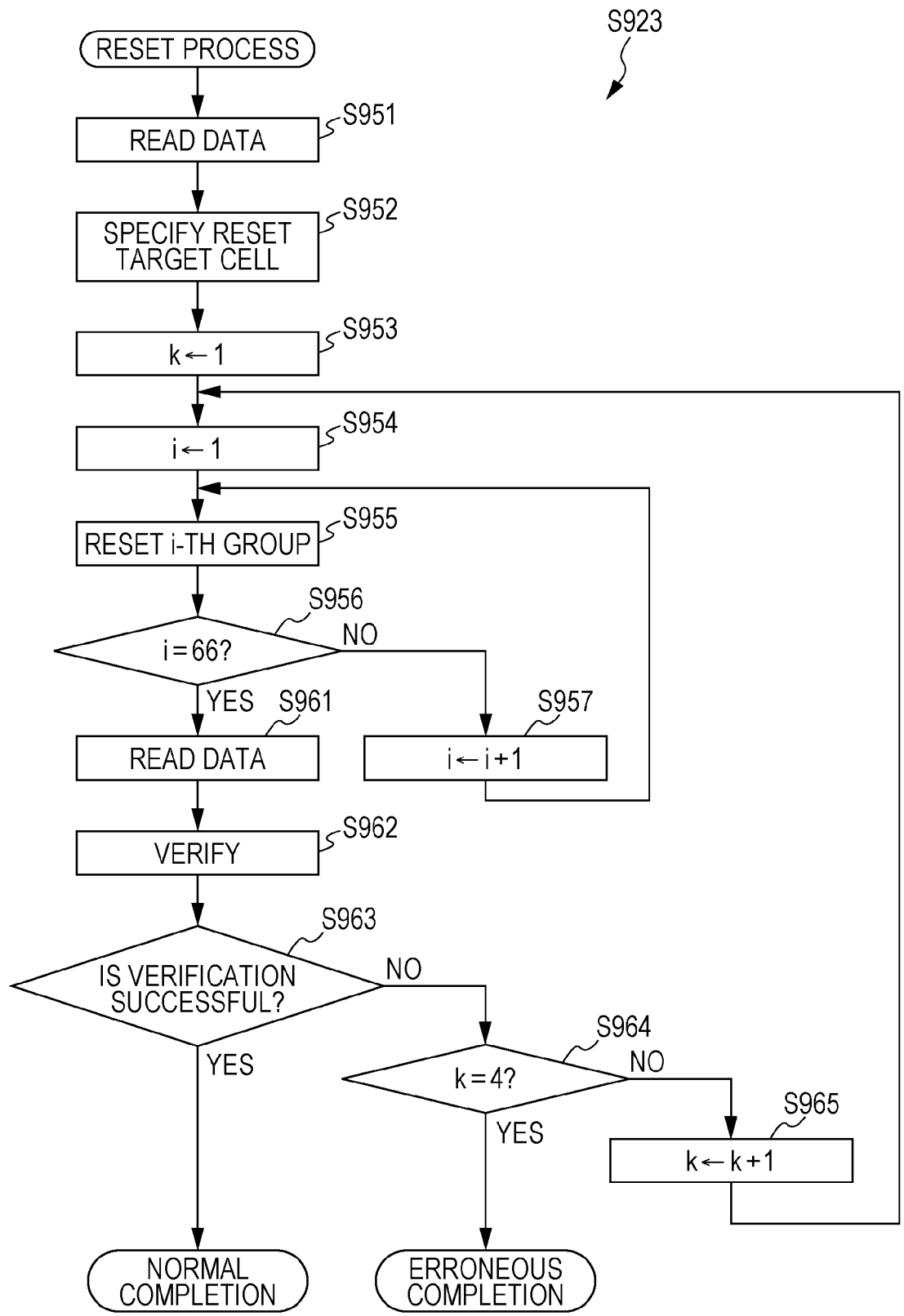
FIG. 19 is a flowchart showing an example of a process procedure of a resetting process of a memory according to an embodiment of the present application.

FIG. 19 is a flowchart showing an example of a process procedure of the resetting process of the memory 300 according to the embodiment of the present application. This resetting process corresponds to the process in Step S923.

This resetting process has the same procedure as the setting process described in FIG. 18. Herein, in the setting process, the memory cell which is the setting target is specified in Step S932, but in this resetting process, the memory cell which is the resetting target is specified in Step S952. Regarding the specified resetting target, the resetting process for each group is performed in Step S955. The other points are the same as those in the setting process described in FIG. 18, the detailed description thereof will be omitted.

Figure 20:
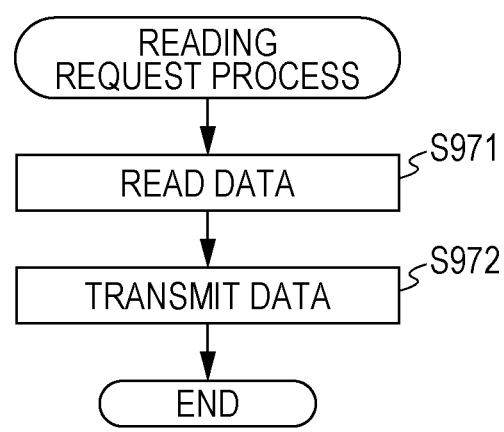
FIG. 20 is a flowchart showing an example of a process procedure of a reading request process according to an embodiment of the present application.

FIG. 20 is a flowchart showing an example of a process procedure of the reading request process according to the embodiment of the present application. This reading request process is started in response to the request in Step S814.

When the reading request and the physical page address are received from the control interface 309, the request processing unit 360 starts the physical page reading process (Step S971). That is, the request processing unit 360 supplies the control signal to the plate control unit 320, the row control unit 311, and the writing control unit 331, and reads out the data having 528 bytes from the designated physical address. The read-out data is transmitted to the read data buffer 342 as the read data and is retained therein.

The request processing unit 360 transmits the data having 528 bytes retained in the read data buffer 342 to the memory controller 200 through the control interface 309 (Step S972). After that, the request processing unit 360 completes the reading request process.

As described above, in the first embodiment of the present application, when the number of errors Ehrs obtained by determining the bits supposed to be in the LRS as the bits in the HRS due to the degradation exceeds the predetermined value, only the setting operation from the setting operation and resetting operation is executed as the refreshing process. Therefore, it is possible to select the memory cell in the degraded LRS as the memory cell necessary for the rewriting of the data and perform the rewriting, without performing the process regarding all memory cells.

First Modification Example

Order of Data Transmission and Refreshing Process

In the first embodiment described above, the refreshing process is performed before the data transmission with respect to the host computer 100 (Step S833), but the refreshing process may be performed after the data transmission.

Second Modification Example

Variable Reference of Number of Errors

In the first embodiment described above, the reference of the number of all errors Eall is set as "5" and the reference of number of errors Ehrs is set as "2", but these may not be fixed values and may be variable. In general, as the number of times of rewriting increases, the data retention characteristics of the non-volatile memory degrade. Accordingly, if the number of times of rewriting performed in the cell in the LRS is great, the data may not be properly read in the small number of times of reading. Meanwhile, the time taken for retaining the data in the cell in the HRS may be shortened. Therefore, the number of times of updating the data for each physical address is counted, and a table in which the physical address and the number of times of updating are associated with each other is retained in the refreshing information management unit 250. The number of times of rewriting corresponding to the physical addresses subjected to the process in Steps S823 and in S824 may be acquired, and the reference according to the number of times of rewriting thereof may be acquired from the table of the refreshing information management unit 250. For example, if the number of times of rewriting is from 0 times to 50000 times, the reference of the number of all errors Eall is set as "5" and the reference of number of errors Ehrs is set as "2", in the same manner as in the embodiment described above. If the number of times of rewriting is from 50001 times to 100000 times, the reference of the number of all errors Eall is set as "4" and the reference of number of errors is set as "2", for example. When the number of times of rewriting exceeds 10001 times, the reference of the number of all errors Eall is set as "4" and the reference of number of errors Ehrs is set as "3", for example.

Third Modification Example

Control Based on Notification from Host Computer

In the first embodiment described above, execution or non-execution of the refreshing process or the switching of the first and second refreshing request processes is determined only based on the number of detected errors, but conditions for the determination may be received from the host computer 100. That is, when the host computer 100 notifies a logical address of invalid data, the memory controller 200 may control so as not to execute the refreshing process of the notified logical address. As such notification, TRIM commands regulated in SATA Revision 3.1 or Dataset Management commands regulated in NVM EXPRESS Revision 1.1 can be assumed, for example. In addition, when the host computer 100 notifies a logical address in which the rewriting of the data is frequently executed, the memory controller 200 may treat all refreshing processes of the notified logical address as the first refreshing request process. As such notification, Dataset Management commands regulated in NVM EXPRESS Revision 1.1 can be assumed, for example.

2. SECOND EMBODIMENT

In the first embodiment described above, the refreshing process is performed during the execution of the reading command, but the refreshing process may be performed after the execution of the reading command. In this case, it is necessary to perform a process for delivering error information. Hereinafter, an example of performing the refreshing process after the execution of the reading command will be described as a second embodiment. The configuration of the information processing system is the same as in the first embodiment, and therefore the detailed description thereof will be omitted.

Operation of Information Processing System

Figure 21:
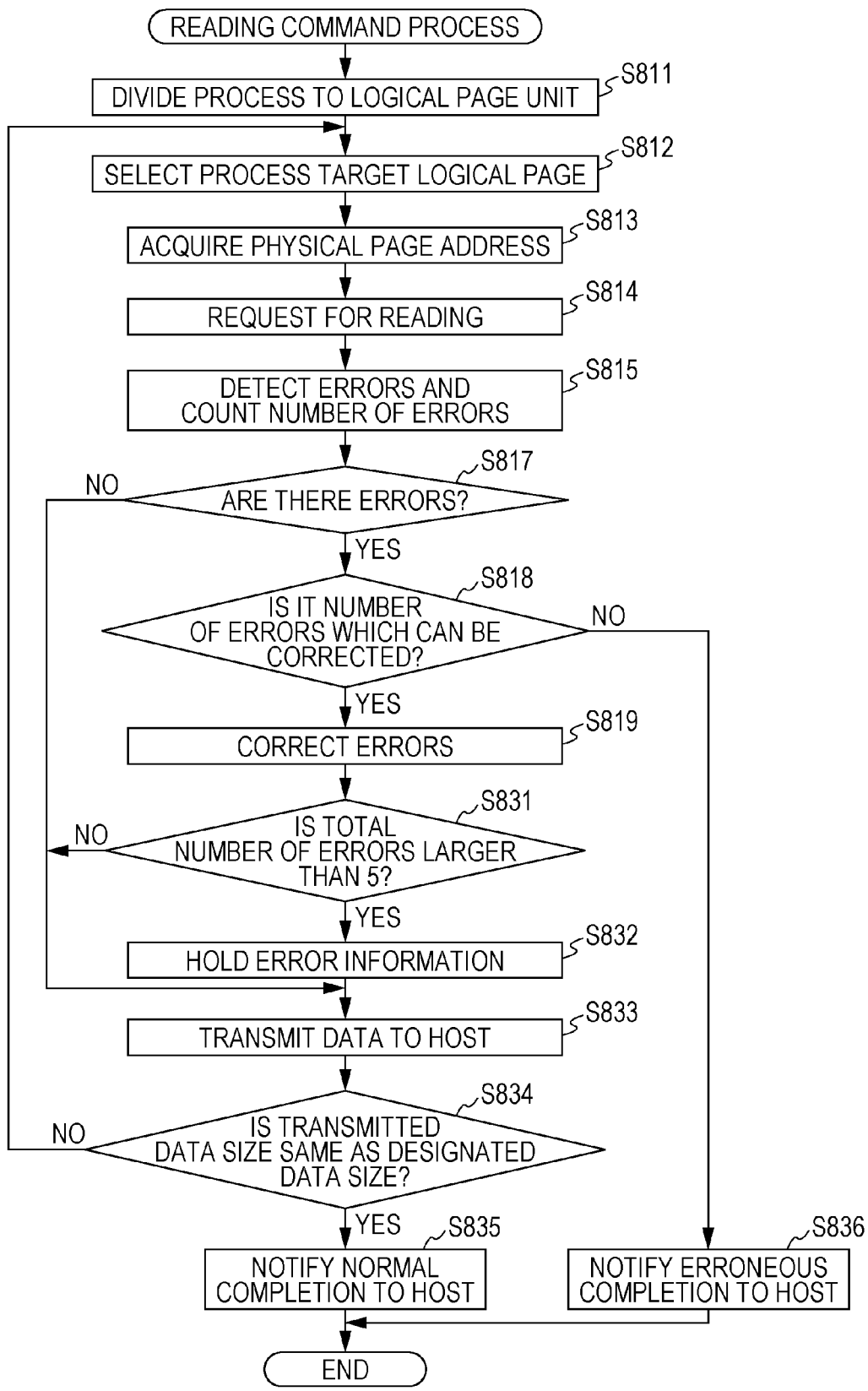
FIG. 21 is a flowchart showing an example of a reading command process procedure of a memory controller according to a second embodiment of the present application.

FIG. 21 is a flowchart showing an example of the reading command process procedure of the memory controller 200 according to the second embodiment of the present application.

This reading command process basically has the same procedure as that in first embodiment described with reference to FIG. 14. However, the refreshing process (Step S820) is executed after the error correction in the first embodiment, but in the second embodiment, it is determined whether or not the number of all errors Eall is greater than "5" (Step S831). When the number of all errors Eall is greater than "5" (Step S831: Yes), the error information is retained in the refreshing information management unit 250 (Step S832). This error information is obtained by associating the physical address in which the error is generated and the number of errors Ehrs counted in Step S815 with each other. The refreshing information management unit 250 retains the error information by a first-in first-out (FIFO) system, and therefore it is possible to perform the refreshing process in the order of error generation.

Figure 22:
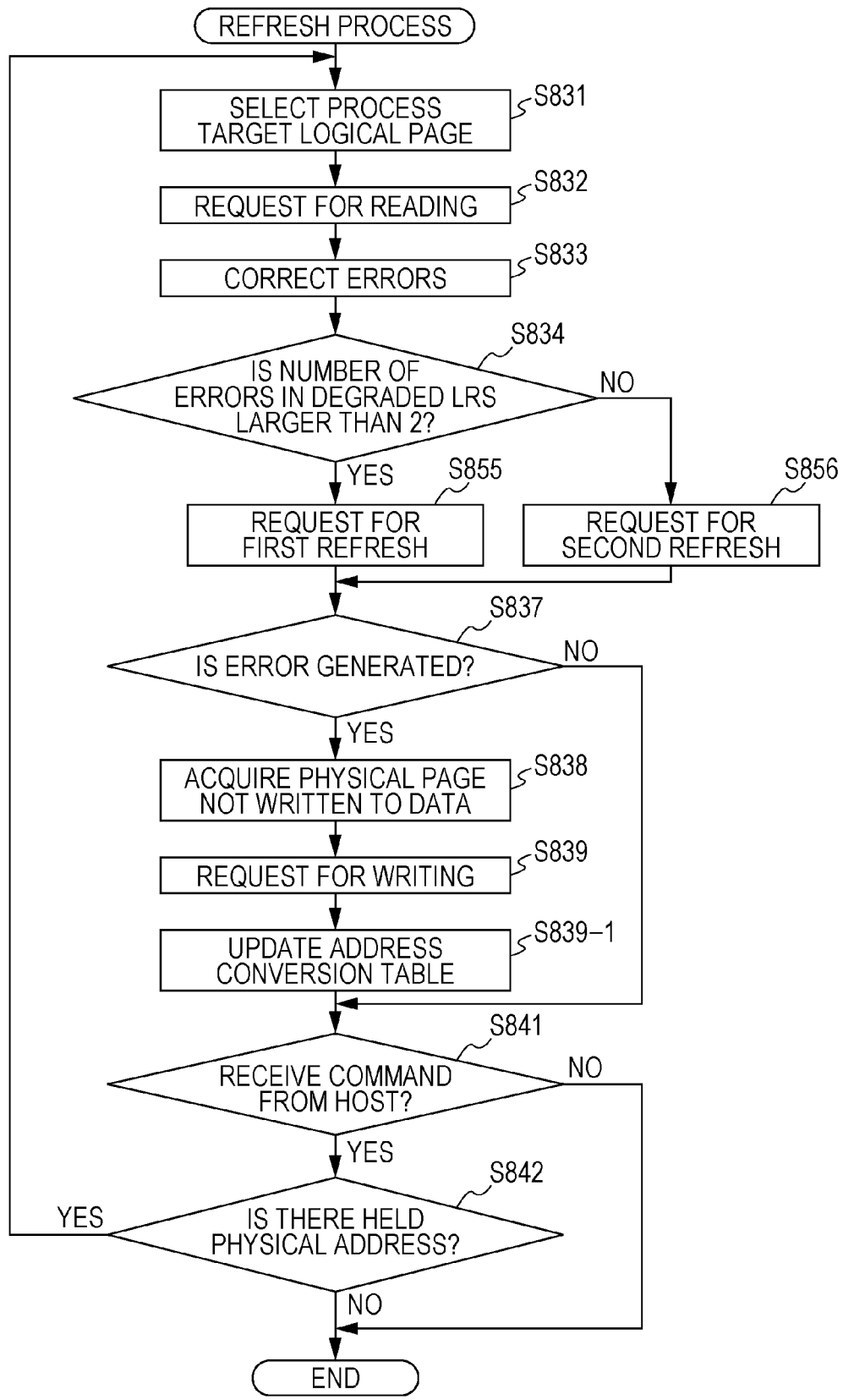
FIG. 22 is a flowchart showing an example of a process procedure of a refreshing process of a memory controller according to a second embodiment of the present application.

FIG. 22 is a flowchart showing an example of a process procedure of the refreshing process of the memory controller 200 according to the second embodiment of the present application. The refreshing process is executed as a part (Step S820) of the reading command process in the first embodiment described above, but in the second embodiment, the memory controller 200 spontaneously performs refreshing process at an arbitrary timing. It is assumed that the refreshing process is spontaneously performed in a state where no process is performed on the memory controller 200 side, such as a state where a command is not received by the memory controller 200 from the host computer 100, for example.

The processor 210 selects the physical address which is the refreshing process target (Step S831). In the second embodiment, the processor 210 reads out the error information retained in the refreshing information management unit 250 in the order from the head of the FIFO system, and selects the physical address included in the error information as the refreshing process target.

The processor 210 designates the selected physical address and makes a request for reading with respect to the memory 300 (Step S832). The data read out from the memory 300 has 528 bytes including the unused area and the redundant bit.

The ECC processing unit 240 performs the error correction of the retained data having 528 bytes (Step S833).

The processor 210 determines whether or not the number of errors Ehrs corresponding to the physical address selected in Step S831 is greater than 2 bits (Step S834). When the number of errors Ehrs is greater than 2 bits (Step S834: Yes), the processor 210 makes a request for the first refreshing of the physical address in which the error is generated, with respect to the memory 300 (Step S835). The first refreshing request process is performed in the memory 300 in the order described with reference to FIG. 16. On the other hand, when the number of errors Ehrs is equal to or smaller than 2 bits (Step S834: No), the processor 210 makes a request for the second refreshing of the physical address in which the error is generated, with respect to the memory 300 (Step S836). The second refreshing request process is performed in the memory 300 in the order described with reference to FIG. 17. The physical address designated in the first refreshing request process or the second refreshing request process is the physical address selected in Step S831.

The processor 210 determines whether or not the error is generated in the process with respect to the request for the first refreshing or the request for the second refreshing (Step S837). When the error is not generated (Step S837: No), the refreshing process ends. When the error is generated (Step S837: Yes), the processor 210 acquires the physical address of the memory 300 which is not allocated to the logical address (Step S838). Then, the processor 210 designates the acquired physical address to make a request to the memory 300 for writing, and performs the writing of the data (Step S839). The written data is data having 528 bytes subjected to the error correction and retained in the ECC processing unit 240. Then, the value of the physical address corresponding to the logical address subjected to the refreshing process in the address conversion table is updated to the value of the physical address subjected to the writing (Step S839-1).

The processor 210 determines whether or not there is an unprocessed command which is a command received from the host computer 100 (Step S841). When there is an unprocessed command which is the received command (Step S841: Yes), the processor further determines whether or not there is a physical address in which the refreshing process is not yet executed from the physical addresses managed by the refreshing information management unit 250 (Step S842). When there is such a physical address (Step S842: Yes), the processes in Step S831 and the subsequent steps are repeated. When there is not such a physical address (Step S842: No), this refreshing process ends.

As described above, according to the second embodiment of the present application, by spontaneously performing the refreshing process in a state where no process is performed on the memory controller 200 side, it is possible to perform the refreshing process without decreasing the capability of the reading command process.

First Modification Example

Management System of Error Information

In the second embodiment described above, the example in which the physical address and the number of errors Ehrs are managed by the FIFO system is shown, but these may be managed by a system other than the FIFO system. In this case, as a method of selecting the physical address in Step S831, a method of selecting the physical address in the order of decreasing values or increasing values can be employed.

As the error information, the physical address may be retained in the RAM 220. In this case, in the refreshing process, in addition to the process in Step S833, the number of bits Ehrs obtained by reading the bits supposed to be "1" as "0" due to the degradation is counted when executing the error correction to be used in the determination in Step S834.

Second Modification Example

Variable Reference of Number of Errors

In the same manner as in the first embodiment described above, the reference of the number of all errors Eall and the reference of number of errors Ehrs may also be set to be variable, in the second embodiment.

Third Modification Example

Control Based on Notification from Host Computer

In the same manner as in the first embodiment described above, the conditions for determination may also be received from the host computer 100 in the second embodiment.

3. THIRD EMBODIMENT

In the first and second embodiments, the switching of the refreshing processes is performed based on the number of errors Ehrs in the degraded low resistance state, but in a third embodiment, the switching of the refreshing processes is performed based on the number of bits in the high resistance state before and after the writing. That is, in the third embodiment, when performing the data writing, the number of "0" (HRS) included in the data having 512 bytes is counted in the bit unit and a value Whrs thereof is retained. Then, a value Rhrs obtained by counting the number of "0" (HRS) included in the read-out data is generated and is compared with the value Whrs. Accordingly, the switching of the refreshing processes is performed so as to perform the first refreshing process when a difference between the value Whrs and the value Rhrs exceeds a predetermined number. The configuration of the information processing system is the same as that in the first and second embodiments, and therefore the detailed description thereof will be omitted.

Data Structure

Figure 23:
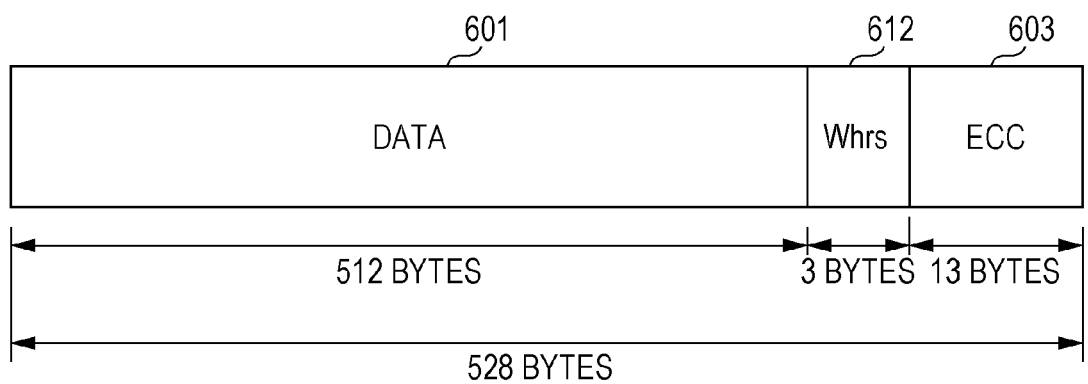
FIG. 23 is a diagram showing an example of a structure of a physical page stored in a memory cell array according to a third embodiment of the present application.

FIG. 23 is a diagram showing an example of a structure of the physical page stored in the memory cell array 310 according to the third embodiment of the present application.

In the first embodiment described above, the area having 3 bytes between the data 601 and the redundant bit 603 is set as the unused area, but in the third embodiment, the area thereof is used as an area 612 for storing the number of bits Whrs in the high resistance state when the writing is performed. Hereinafter, this area 612 is assumed to be data not protected by the ECC, but may be a target protected by the ECC.

Operation of Information Processing System

Figure 24:
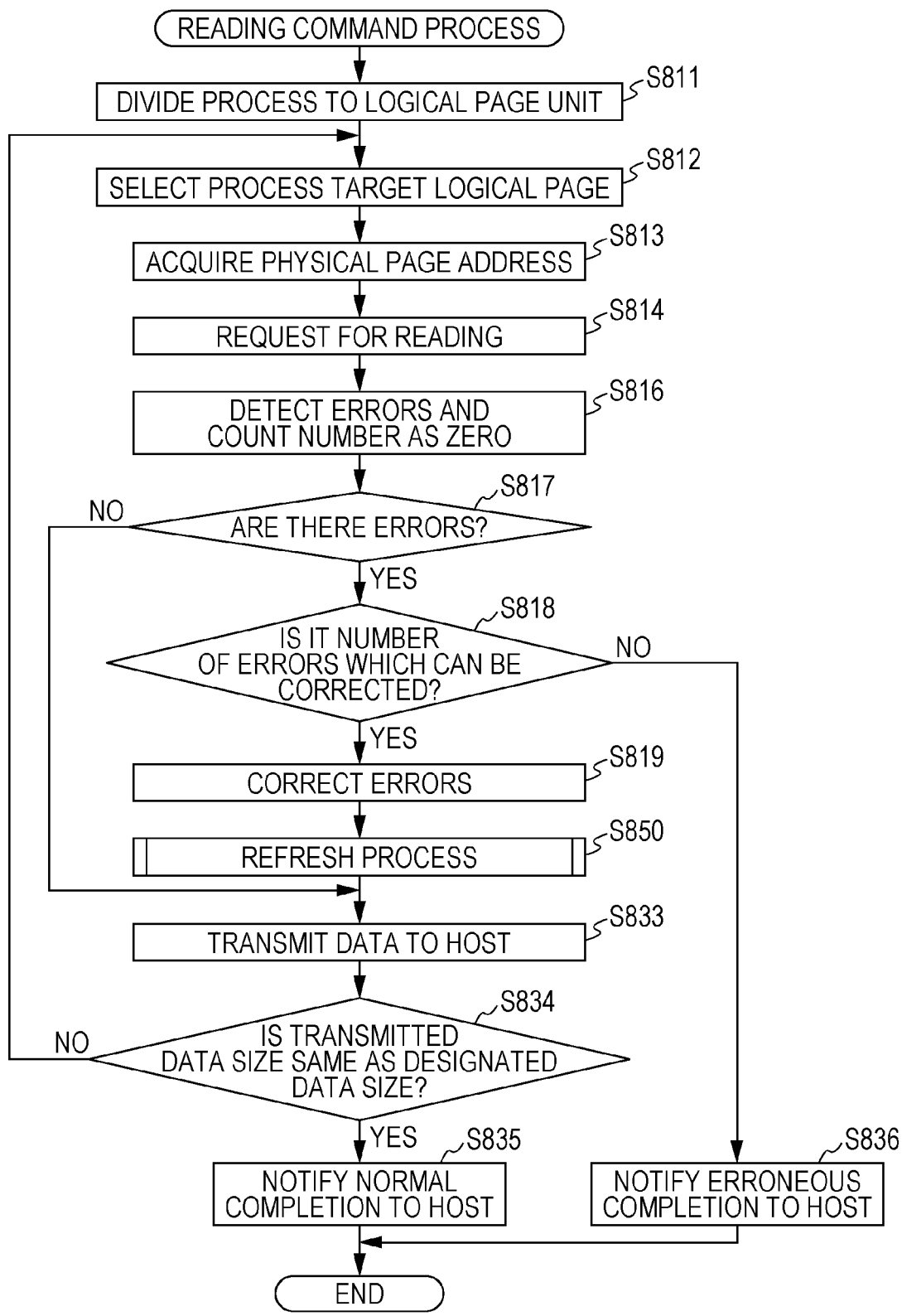
FIG. 24 is a flowchart showing an example of a reading command process procedure of a memory controller according to a third embodiment of the present application.

FIG. 24 is a flowchart showing an example of the reading command process procedure of the memory controller 200 according to the third embodiment of the present application.

This reading command process basically has the same procedure as that in the first embodiment described with reference to FIG. 14. However, in the first embodiment, the ECC processing unit 240 counts the number of errors in Step S815, but in the third embodiment, instead thereof, the processor 210 counts the number of "0" included in the data in the bit unit (Step S816). The counted value herein is set to the value Rhrs. Then, the counted value Rhrs and the value Whrs in the area 612 included in the read-out data are referred to perform the refreshing process (Step S850).

Figure 25:
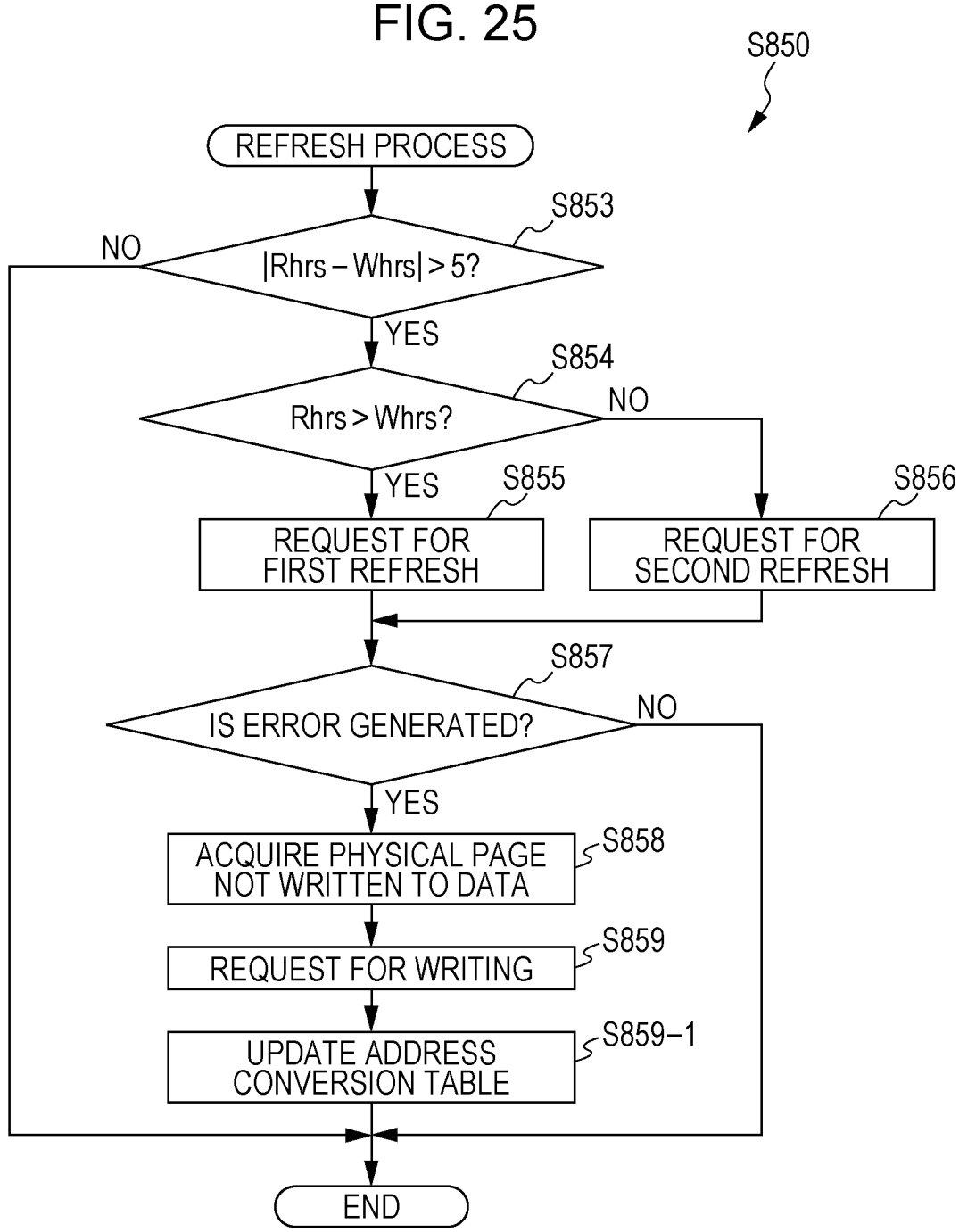
FIG. 25 is a flowchart showing an example of a process procedure of a refreshing process (Step S850) of a memory controller according to a third embodiment of the present application.

FIG. 25 is a flowchart showing an example of a process procedure of the refreshing process (Step S850) of the memory controller 200 according to the third embodiment of the present application.

The processor 210 calculates an absolute value of the number obtained by subtracting the value Whrs from the value Rhrs, to determine whether or not the value thereof is greater than "5" (Step S853). When the value thereof is equal to or smaller than "5", the refreshing process ends (Step S853: No).

The processor 210 compares the value Rhrs and the value Whrs with each other to determine a magnitude relationship therebetween (Step S854). Accordingly, it is possible to compare the number of cells in the degraded LRS and the number of cells in the degraded HRS. When the value Rhrs is greater (Step S854: Yes), the processor 210 makes a request for the first refreshing of the physical address in which the error is generated, with respect to the memory 300 (Step S855). The first refreshing request process is performed in the memory 300 in the order described with reference to FIG. 16. On the other hand, when the value Rhrs is not greater (Step S854: No), the processor 210 makes a request for the second refreshing of the physical address in which the error is generated, with respect to the memory 300 (Step S856). The second refreshing request process is performed in the memory 300 in the order described with reference to FIG. 17.

The processor 210 determines whether or not the error is generated in the process with respect to the request for the first refreshing or the request for the second refreshing (Step S857). When the errors are not generated (Step S857: No), the refreshing process ends. When the errors are generated (Step S857: Yes), the processor 210 acquires the physical address of the memory 300 which is not allocated to the logical address (Step S858). The acquired physical address is designated to make a request to the memory 300 for writing, and the writing of the data is performed (Step S859). The data to be written is data having 528 bytes subjected to the error correction and retained in the ECC processing unit 240. In addition, at that time, the processor 210 counts the number of "0" included in the data and writes the number thereof in the area 612 as the value Whrs. Then, the value of the physical address corresponding to the logical address subjected to the refreshing process in the address conversion table is updated to the value of the written physical address (Step S859-1).

As described above, according to the third embodiment of the present application, it is possible to control the switching of the refreshing process by counting and comparing the number of "0" (HRS) before and after the writing.

Modification Example

Example of Performing Refreshing Process after Executing Reading Command

In the third embodiment, the refreshing process is performed during the execution of the reading command, but the refreshing process may be performed after the execution of the reading command in the same manner as in the second embodiment. Accordingly, it is possible to spontaneously perform the refreshing process in the state where no process is performed on the memory controller 200 side, and to perform the refreshing process without decreasing the capability of the reading command process.

4. FOURTH EMBODIMENT

In the embodiment described above, the switching of the refreshing process is controlled based on a basic value such as the number of errors in the degraded low resistance state or the number of bits in the high resistance state before and after the writing, but in a fourth embodiment, the degraded state of the memory cells is determined based on a measured amount. As the factors of the degradation of the state of the memory cells of the non-volatile memory, there is reading and secular variation in a case of the memory cell in the LRS, and there is secular variation in a case of the memory cell in the HRS. Therefore, the application of a method of performing the refreshing of the memory cell in the LRS according to the number of times of reading and performing the refreshing of the memory cells in the LRS and the HRS according to the elapsed time after the data writing, is considered.

In the fourth embodiment, as an example, regarding an uncorrectable bit error rate (UBER) guaranteed in a storage system, "UBER<$10^{-10}$" is assumed. That is, when the raw bit error rate (RBER) of the data read out from the memory 300 satisfies "RBER<$10^{-4}$", the ECC processing unit 240 of the memory controller 200 sets correction capability for guaranteeing "UBER<$10^{-10}$". Herein, the UBER is a rate of errors reported to the host computer 100 as uncorrectable errors, and the RBER is an error generation rate in the state before the error correction which is read out from the memory 300. As the characteristics of the non-volatile memory, "RBER<$10^{-5}$" is satisfied immediately after the data writing, but the memory cell in the LRS satisfies "RBER<$10^{-4}$" when the number of times of reading exceeds 10000 times. In addition, when the state in which the data is retained for 5 years continues as it is, the memory cells in the LRS and the HRS both satisfy "RBER<$10^{-4}$".

Therefore, in the fourth embodiment, the request for the first refreshing is made regarding the memory cell in the LRS after 10000 times of reading, and the request for the second refreshing is made regarding the memory cells in the LRS and the HRS when 5 years has elapsed after the data writing. The refreshing process executed by the request for the first refreshing is performed during the reading command execution. On the other hand, the refreshing process executed by the request for the second refreshing is performed immediately after power-on of the storage systems (memory controller 200 and the memory 300).

In the fourth embodiment, a clock is not provided in the storage systems, and application of the conditions of not notifying time from the host computer 100 is attempted. The system in which the power is regularly turned on and of is assumed as a use case of the storage system of the fourth embodiment, and a case of performing turning on and off of the power of the storage system once a day is assumed.

As an alternative method for measuring the elapsed time, in the fourth embodiment, the number of times the power of the storage system has been turned on is used. In the storage system of the fourth embodiment, the processor 210 counts the number of times the power has been turned on after the manufacture of the storage system, and retains the number thereof in the refreshing information management unit 250. This "number of times the power has been turned on" is a value which increases each time when the power of the storage system has been turned on and is not cleared. In a case of providing a clock in the storage system or in a case where the time is notified to the storage system from the host computer 100, the updated date and time may be directly managed.

Information Management Table

FIG. 26 is a diagram showing a configuration example of a refreshing information management table according to the fourth embodiment of the present application. This refreshing information management table is retained in the refreshing information management unit 250. In this refreshing information management table, the number of times of reading and the number of times the power has been turned on during updating the data are managed for each physical address.

The "number of times of reading" shows the number of times the reading-out is performed from the corresponding physical address. This "number of times of reading" is cleared to "0" when the data written to the corresponding physical address is updated or when the first or second refreshing request process is executed. This "number of times of reading" increases ("1" is added thereto") when a request for reading is made.

The "number of times the power has been turned on during updating the data" shows the number of times the power is turned on when the data written to the corresponding physical address is updated. This "number of times the power is turned on during updating the data" is substituted with the "number of times the power is turned on" retained in the refreshing information management unit 250, when the data written to the corresponding physical address is updated or the second refreshing request process is executed. As described above, the "number of times the power has been turned on" retained in the refreshing information management unit 250 is a value which increases each time when the power of the storage system is turned on and is not cleared. Accordingly, this functions as a time stamp using the number of times as a unit. Therefore, it is possible to obtain the number of times the power of the memory system has been turned on after the updating of the data, by subtracting the "number of times the power has been turned on when updating the data" from the "number of times the power has been turned on" retained in the refreshing information management unit 250.

Operation of Information Processing System

Figure 27:
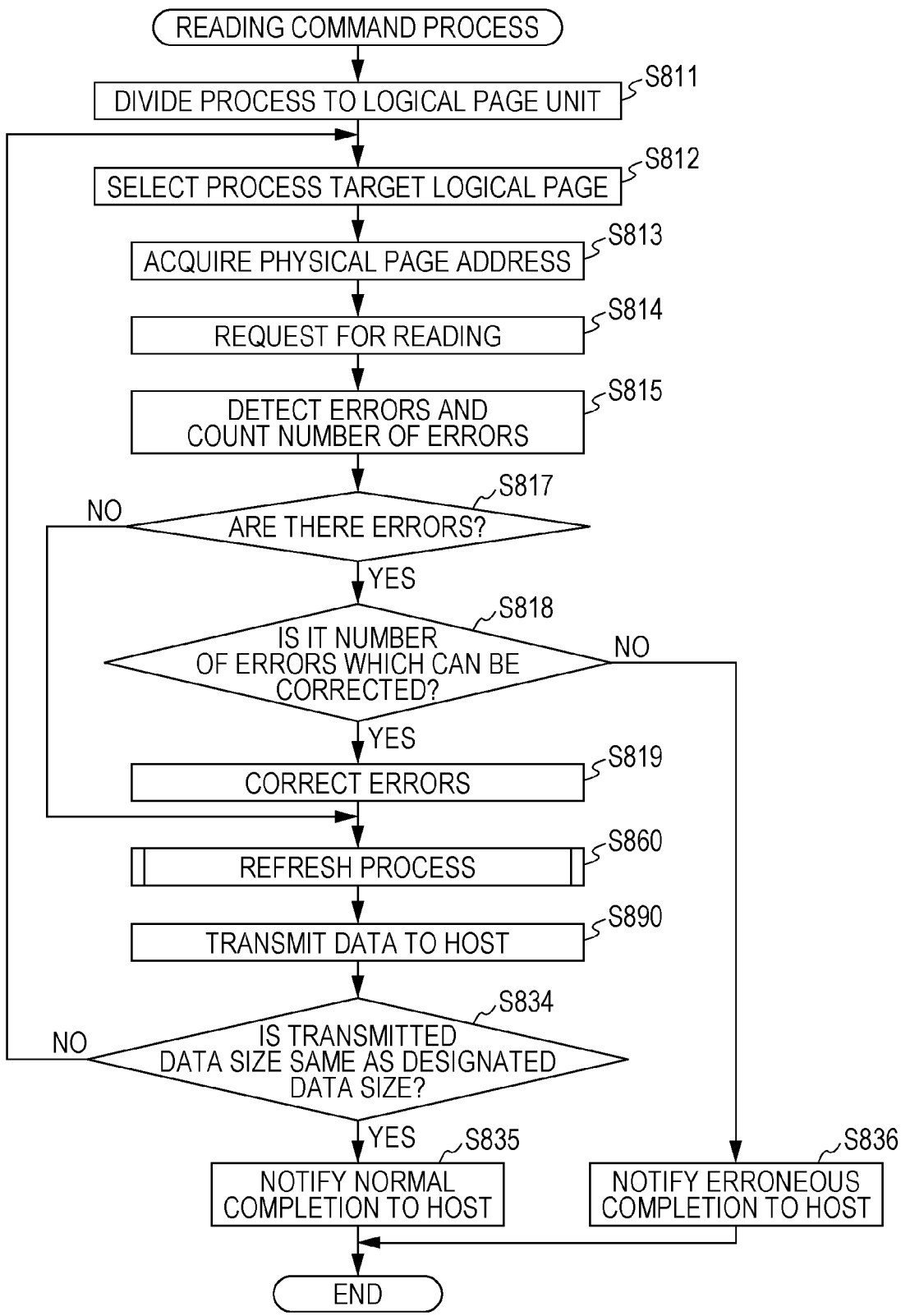
FIG. 27 is a flowchart showing an example of a reading command process procedure of a memory controller according to a fourth embodiment of the present application.

FIG. 27 is a flowchart showing an example of the reading command process procedure of the memory controller 200 according to the fourth embodiment of the present application.

This reading command process basically has the same procedure as that in first embodiment described with reference to FIG. 14. However, as will be described below, the details of the refreshing process (Step S860) is different.

Figure 28:
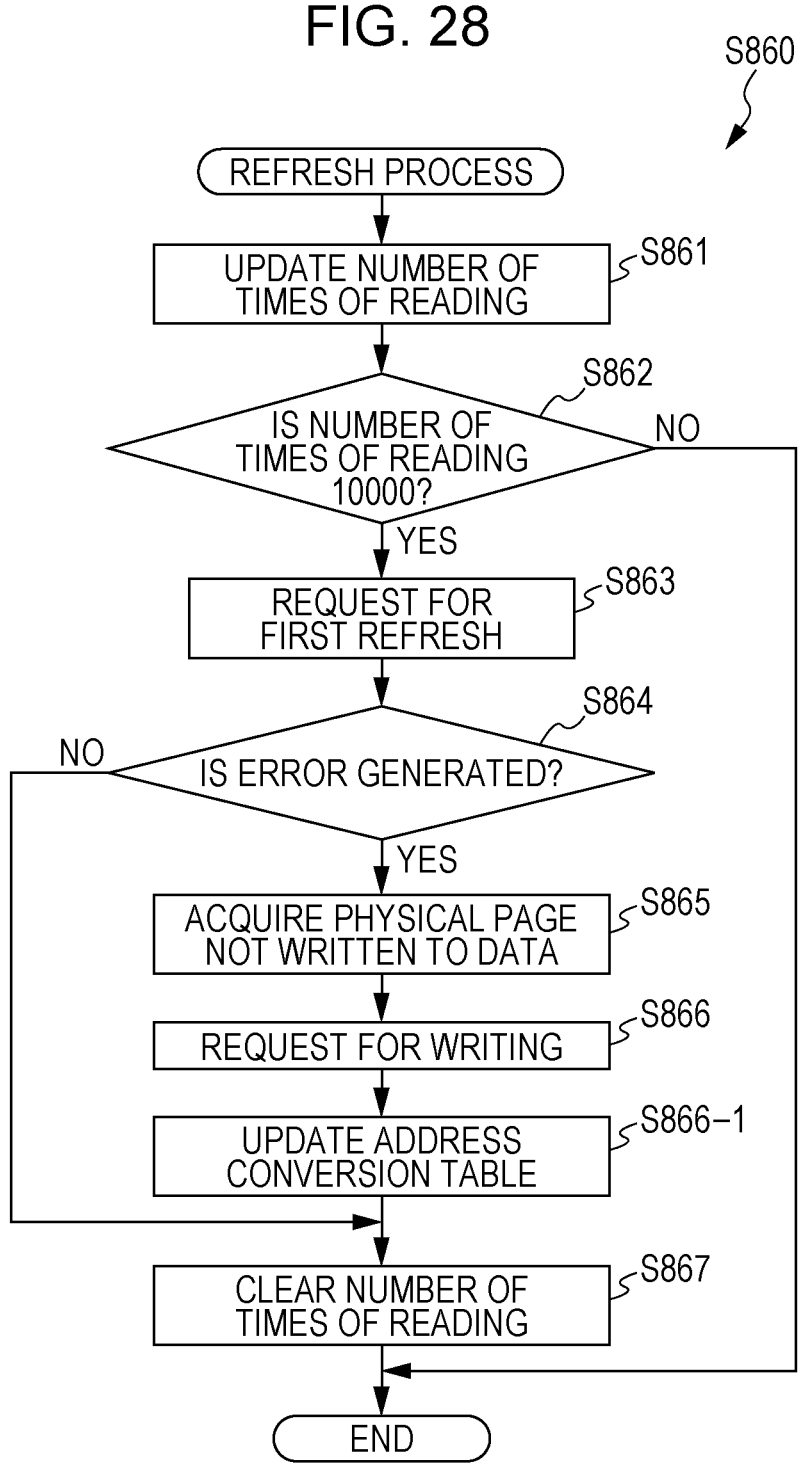
FIG. 28 is a flowchart showing an example of a process procedure of a refreshing process (Step S860) of a memory controller according to a fourth embodiment of the present application.

FIG. 28 is a flowchart showing an example of a process procedure of the refreshing process (Step S860) of the memory controller 200 according to the fourth embodiment of the present application.

The processor 210 increases the "number of times of reading" corresponding to the physical address for which the request for the reading out of the data is made, in the refreshing information management table (Step S861).

The processor 210 determines whether or not the increased "number of times of reading" has reached 10000 times (Step S862). When the "number of times of reading" has not reached 10000 times (Step S862: No), the process ends without performing the refreshing process. When the "number of times of reading" reaches 10000 times (Step S862: Yes), the processor 210 makes a request for the first refreshing of the physical address, with respect to the memory 300 (Step S863).

The processor 210 determines whether or not the error is generated in the process with respect to the request for the first refreshing (Step S864). When the error is generated (Step S864: Yes), the processor 210 acquires the physical address of the memory 300 which is not allocated to the logical address (Step S865). Then, the processor 210 designates the acquired physical address to make a request to the memory 300 for writing, and performs the writing of the data (Step S866). The written data is data having 528 bytes subjected to the error correction and retained in the ECC processing unit 240. Then, the value of the physical address corresponding to the logical address subjected to the refreshing process in the address conversion table is updated to the value of the physical address subjected to the writing (Step S866-1). On the other hand, when the error is not generated (Step S864: Yes), these processes are not performed.

The processor 210 clears the "number of times of reading" corresponding to the physical address for which the request for the first refreshing is made, to "0" (Step S867), and completes the refreshing process.

Figure 29:
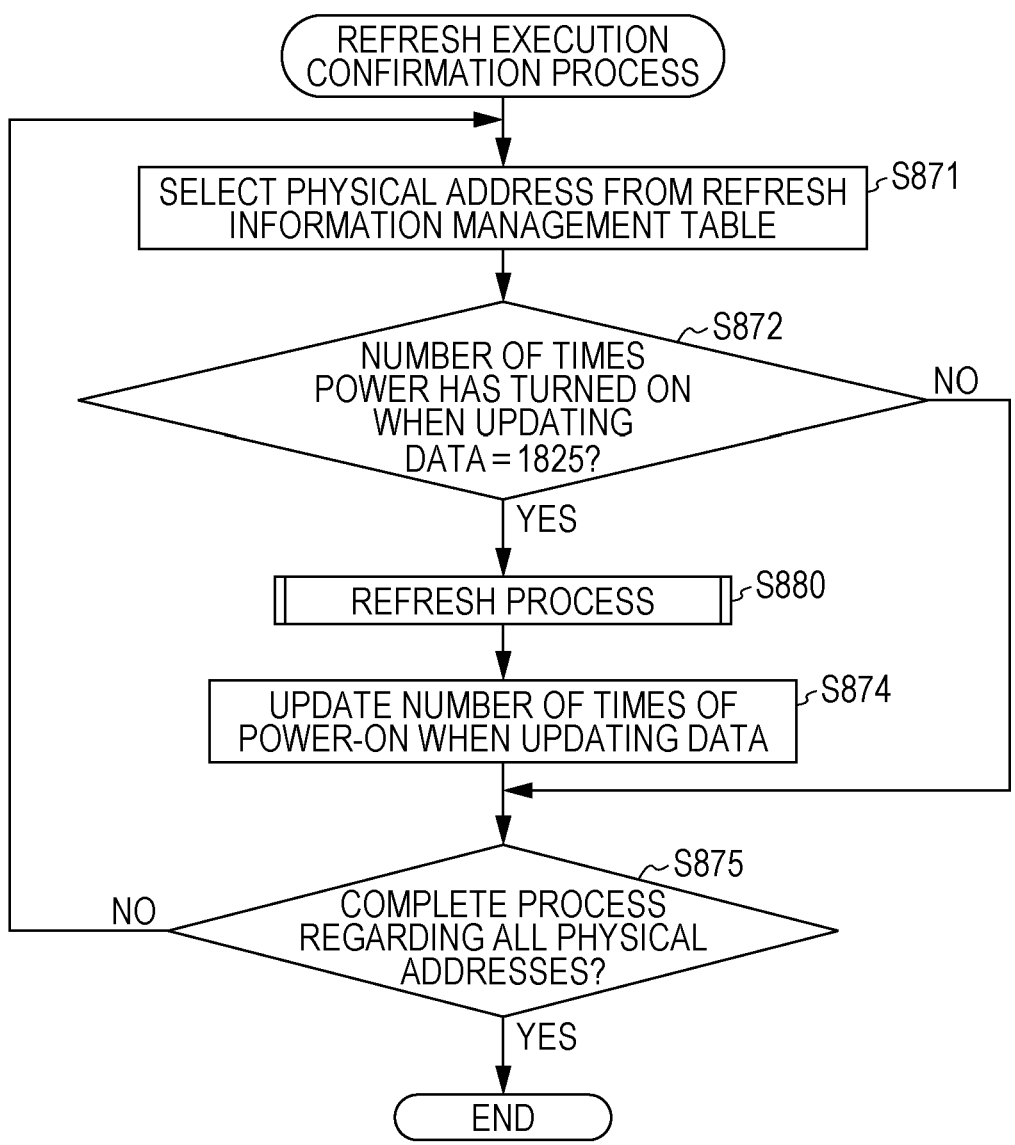
FIG. 29 is a flowchart showing an example of a refreshing execution confirmation process procedure of a memory controller according to a fourth embodiment of the present application.

FIG. 29 is a flowchart showing an example of a refreshing execution confirmation process procedure of the memory controller 200 according to the fourth embodiment of the present application. This refreshing execution confirmation process is executed immediately after the power to the memory controller 200 is applied.

The processor 210 selects the physical address managed in the refreshing information management table in the order of small value, and acquires the value of the "number of times the power has been turned on when updating the data" of the selected physical address (Step S871).

The processor 210 subtracts the "number of times the power has been turned on when updating the data" acquired in Step S871 from the "number of times the power has been turned on" retained in the refreshing information management unit 250, and determines whether or not the number thereof has reached 1825 times (Step S872). This 1825 times corresponds to the number of times the power has been turned on over 5 years. When the number thereof reaches 1825 times (Step S872: Yes), the refreshing process (Step S880) is executed. The "number of times the power has been turned on when updating the data" of the physical address selected in Step S871 is updated to the "number of times the power has been turned on" retained in the refreshing information management unit 250 (Step S874). When the number thereof has not reached 1825 times (Step S872: No), these processes are not executed.

The processor 210 determines whether or not the process is completed regarding all physical addresses managed in the refreshing information management table (Step S875). When the process is not completed regarding all physical addresses (Step S875: No), the processes in Step S871 and the subsequent steps are repeated. When the process is completed regarding all physical addresses (Step S875: Yes), the refreshing execution confirmation process ends.

Figure 30:
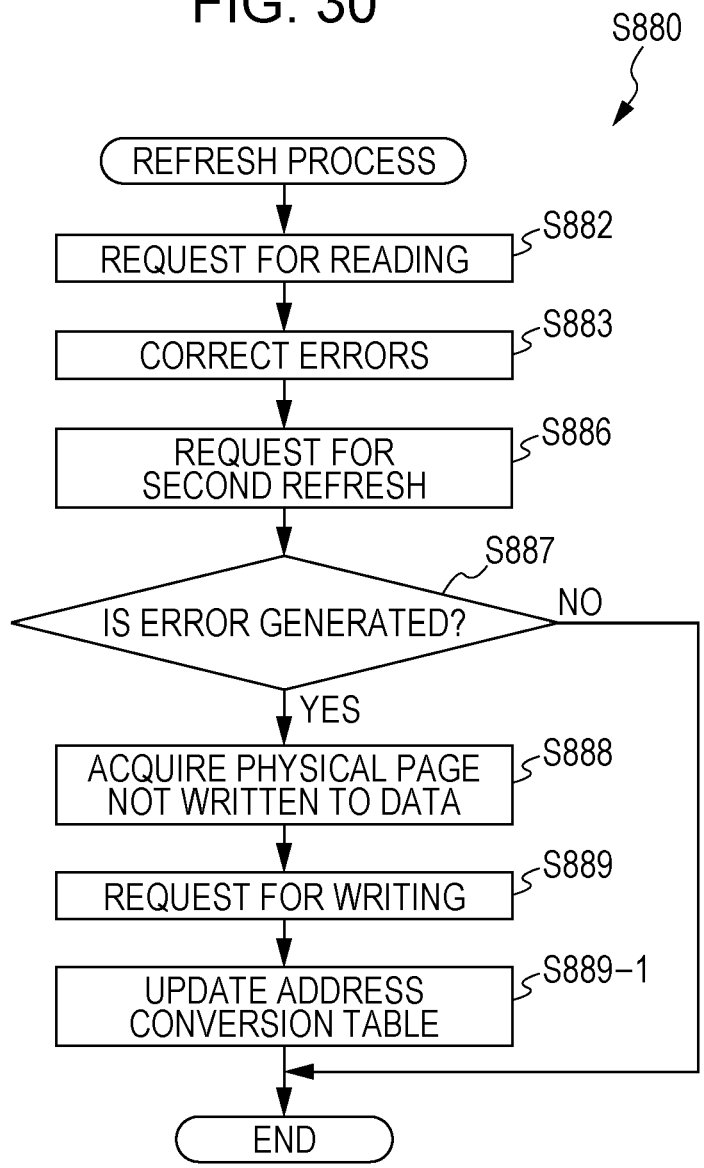
FIG. 30 is a flowchart showing an example of a process procedure of a refreshing process (Step S880) of a memory controller according to a fourth embodiment of the present application.

FIG. 30 is a flowchart showing an example of a process procedure of the refreshing process (Step S880) of the memory controller 200 according to the fourth embodiment of the present application.

The processor 210 designates the physical address selected in Step S871 and makes a request for reading with respect to the memory 300 (Step S882). The data read out from the memory 300 has 528 bytes including the unused area and the redundant bit.

The data having 528 bytes read out from the memory 300 is transmitted to the ECC processing unit 240. The ECC processing unit 240 performs the error correction of the data having 528 bytes, and retains the corrected result thereof (Step S883).

The processor 210 makes a request for the second refreshing of the physical address in which the error is generated, with respect to the memory 300 (Step S886). The second refreshing request process is performed in the memory 300 in the order described with reference to FIG. 17. The physical address designated in the second refreshing request process is the physical address selected in Step S871, and the data to be transmitted is the corrected data having 528 bytes retained in the ECC processing unit 240.

The processor 210 determines whether or not the error is generated in the process with respect to the request for the second refreshing (Step S887). When the error is not generated (Step S887: No), the refreshing process ends. When the error is generated (Step S887: Yes), the processor 210 acquires the physical address of the memory 300 which is not allocated to the logical address (Step S888). Then, the processor 210 designates the acquired physical address to make a request to the memory 300 for writing, and performs the writing of the data (Step S889). The data to be written is the data having 528 bytes subjected to the error correction and retained in the ECC processing unit 240. Then, the value of the physical address corresponding to the logical address subjected to the refreshing process in the address conversion table is updated to the value of the physical address subjected to the writing (Step S889-1).

As described above, in the fourth embodiment of the present application, the request for the first refreshing is made based on the number of times of reading managed for each physical address, and the request for the second refreshing is made based on the number of times the power has been turned on managed for each physical address. Therefore, it is possible to determine the degraded state of the memory cell based on the measured amount and to control the switching of the refreshing process, without using a specific value regarding the memory 300.

First Modification Example

Variable Number of Times of Reading or Number of Times Power has been Turned On

In the fourth embodiment described above, the reference of the number of times of reading is set as "10000" and the reference of the number of times power has been turned on is set as "1825 times (5 years)", but these may not be fixed values and may be variable. In general, as the number of times of rewriting increases, the data retention characteristics of the cell of the non-volatile memory degrade. Therefore, when the number of times of rewriting is from 0 times to 50000 times, for example, the reference of the number of times of reading is set as "10000" and the reference of the number of times power has been turned on is set as "1825 times (5 years)", in the same manner as in the embodiment described above. When the number of times of rewriting is from 50001 times to 100000 times, the reference of the number of times of reading is set as "5000" and the reference of the number of times power has been turned on is set as "1095 (3 years)", for example. When the number of times of rewriting exceeds 10001 times, the reference of the number of times of reading is set as "3000" and the reference of the number of times power has been turned on is set as "365 (1 year)", for example.

Second Modification Example

Control Based on Notification from Host Computer

In the same manner as in the first embodiment described above, the conditions for determination may also be received from the host computer 100 in the fourth embodiment.

5. FIFTH EMBODIMENT

In the fourth embodiment, the degraded state of the memory cell is determined based on the number of times of reading as the measured amount. Herein, the factor of the change in the state of the cells in the LRS and the HRS, is secular variation in both the cells in the LRS and the HRS. Therefore, in the fifth embodiment, the degraded state of the memory cell is determined using the elapsed period from a time point when the refreshing is performed as the measured amount.

As described above, when the raw bit error rate (RBER) of the data read out from the memory 300 satisfies "RBER<$10^{-4}$", the ECC processing unit 240 of the memory controller 200 sets correction capability for guaranteeing "UBER<$10^{-10}$". As the characteristics of the non-volatile memory assumed in the fifth embodiment, "RBER<$10^{-5}$" is satisfied immediately after the data writing, and the cell in the LRS satisfies "RBER<$10^{-4}$" when the state in which the data is stored for 2 years continues as it is. In addition, when the state in which the data is retained for 5 years continues as it is, the memory cell in the HRS satisfies "RBER<$10^{-4}$". Therefore, in the fifth embodiment, the refreshing (first refreshing process) of the cell in the LRS is performed for every time when 2 years has elapsed after the data writing, and the refreshing (second refreshing process) of the cells in the LRS and the HRS is performed for every time when 5 years has elapsed after the data writing.

In the fifth embodiment, it is assumed that the storage system issues a command fir notifying the date from the host computer 100 once a day, at the time of application of power to the storage system and while the power is supplied. The storage system retains the latest date among the dates notified from the host computer 100 in the refreshing information management unit 250.

When the command for notifying the date is received from the host computer 100, the memory controller 200 updates the date retained in the refreshing information management unit 250 and notifies the execution completion of the command to the host computer 100. After the execution completion of the command for notifying the date is notified to the host computer 100, when the latest date managed by the refreshing information management unit 250 is updated, the memory controller 200 starts the refreshing execution confirmation process. In this refreshing execution confirmation process, it is determined whether or not the refreshing process is executed with respect to each of the physical pages.

Information Management Table

FIG. 31 is a diagram showing a configuration example of the refreshing information management table according to the fifth embodiment of the present application. This refreshing information management table is retained in the refreshing information management unit 250. In the refreshing information management table in the fifth embodiment, the date of last LRS cell refreshing and the date of last HRS cell refreshing are managed for each physical address.

The "date of last LRS cell refreshing" indicates the date when the cell in the LRS is lastly refreshed, among the cells corresponding to the physical address. The "date of last HRS cell refreshing" indicates the date when the cell in the HRS is lastly refreshed, among the cells corresponding to the physical address.

Operation of Information Processing System

Figure 32:
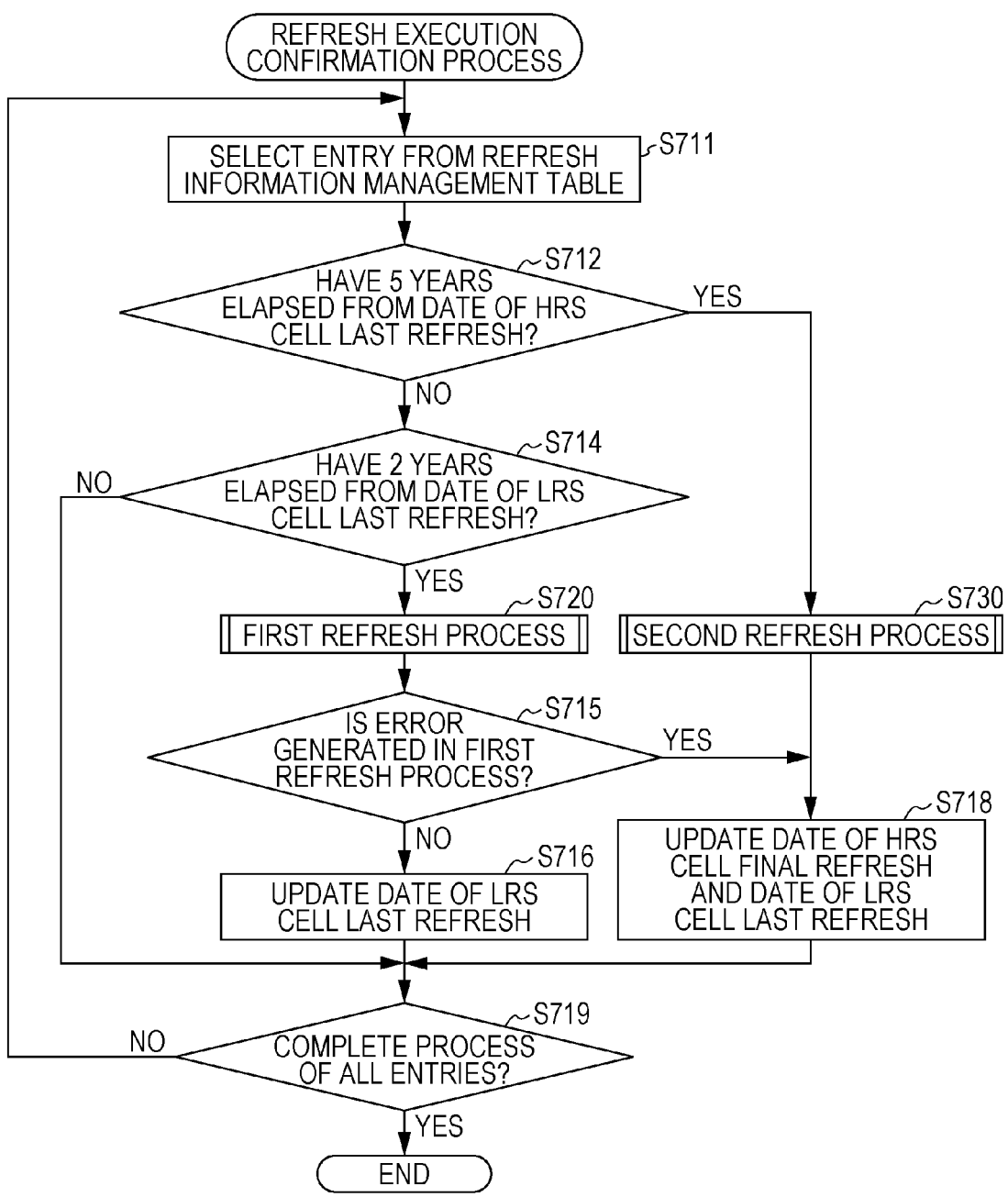
FIG. 32 is a flowchart showing an example of a refreshing execution confirmation process procedure of a memory controller according to a fifth embodiment of the present application.

FIG. 32 is a flowchart showing an example of the refreshing execution confirmation process procedure of the memory controller 200 according to the fifth embodiment of the present application.

First, the processor 210 selects an entry managed in the refreshing information management table in the order from the smallest physical address and acquires a value of the "date of last LRS cell refreshing" and the "date of last HRS cell refreshing" (Step S711). Then, it is determined whether or not 5 years has elapsed from the "date of last HRS cell refreshing", according to the "date of last HRS cell refreshing" and the latest date retained in the refreshing information management unit 250 (Step S712).

When 5 years has elapsed from the "date of last HRS cell refreshing" (Step S712: Yes), the second refreshing process (Step S730) is executed. After that, the values of the "date of last LRS cell refreshing" and the "date of last HRS cell refreshing" are updated to the latest date retained in the refreshing information management unit 250 (Step S718).

When 5 years has not elapsed from the "date of last HRS cell refreshing" (Step S712: No), it is determined whether or not 2 years has elapsed from the "date of last LRS cell refreshing" (Step S714). At that time, the "date of last LRS cell refreshing" and the latest date retained in the refreshing information management unit 250 are referred to. When 2 years has elapsed from the "date of last LRS cell refreshing" (Step S714: Yes), the first refreshing process (Step S720) is executed. At that time, when the error is generated in the first refreshing process (Step S715: Yes), the refreshing is assumed to be executed in the cells in the HRS and the LRS, and accordingly the date of last HRS cell refreshing and the date of last LRS cell refreshing are updated (Step S718). On the other hand, when the error is not generated in the first refreshing process (Step S715: No), the value of the "date of last LRS cell refreshing" is updated to the latest date retained in the refreshing information management unit 250 (Step S716).

Meanwhile, when 5 years has not elapsed from the "date of last HRS cell refreshing" and 2 years has not elapsed from the "date of last LRS cell refreshing" (Step S714: No), the refreshing process is not performed.

When the process is performed for one entry of the physical addresses managed in the refreshing information management table, each entry is selected in the order from the smallest physical address and is processed, until all entries are processed (Step S719).

Figure 33:
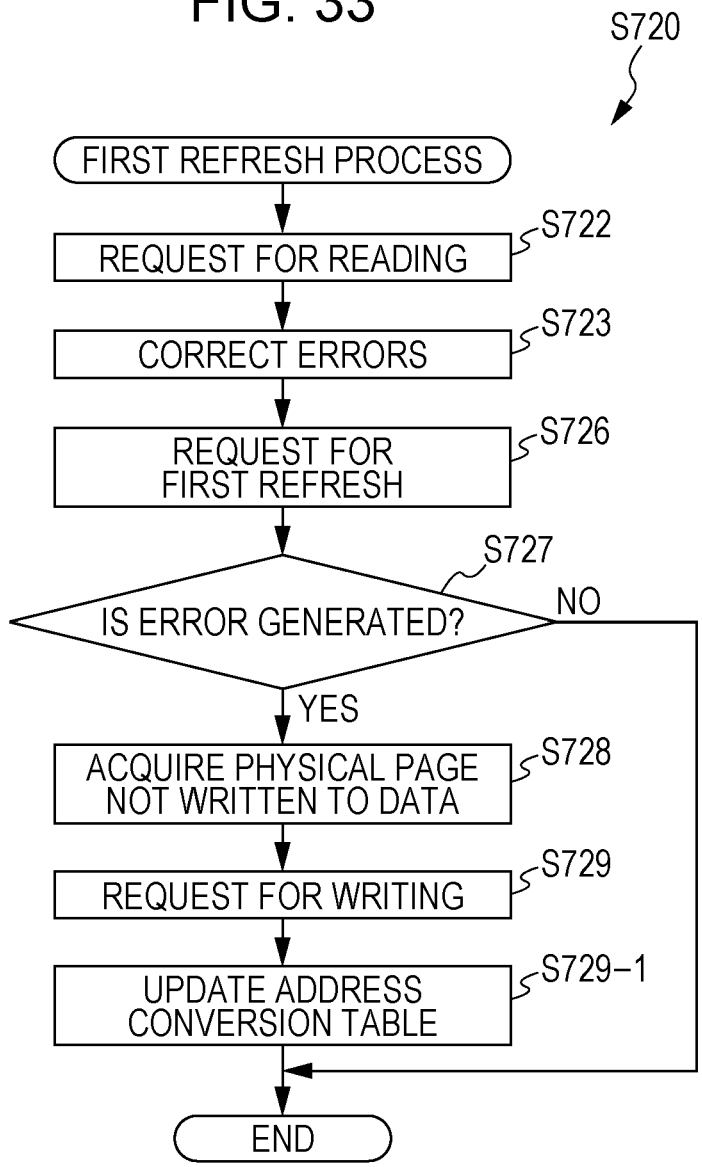
FIG. 33 is a flowchart showing an example of a process procedure of a first refreshing process (Step S720) of a memory controller according to a fifth embodiment of the present application.

FIG. 33 is a flowchart showing an example of a process procedure of the first refreshing process (Step S720) of the memory controller 200 according to the fifth embodiment of the present application.

The processor 210 designates the physical address selected in Step S711 and makes a request for reading with respect to the memory 300 (Step S722). The data read out from the memory 300 has 528 bytes including the unused area and the redundant bit.

The data having 528 bytes read out from the memory 300 is transmitted to the ECC processing unit 240. The ECC processing unit 240 performs the error correction of the data having 528 bytes, and retains the corrected result thereof (Step S723).

The processor 210 makes a request for the first refreshing of the physical address in which the error is generated, with respect to the memory 300 (Step S726). The first refreshing request process is performed in the memory 300 in the order described with reference to FIG. 16. The physical address designated in the first refreshing request process is the physical address selected in Step S711, and the data to be transmitted is the corrected data having 528 bytes retained in the ECC processing unit 240.

The processor 210 determines whether or not the error is generated in the process with respect to the request for the first refreshing (Step S727). When the error is not generated (Step S727: No), the refreshing process ends. When the error is generated (Step S727: Yes), the processor 210 acquires the physical address of the memory 300 which is not allocated to the logical address (Step S728). Then, the processor 210 designates the acquired physical address to make a request to the memory 300 for writing, and performs the writing of the data (Step S729). The data to be written is the data having 528 bytes subjected to the error correction and retained in the ECC processing unit 240. Then, the value of the physical address corresponding to the logical address subjected to the refreshing process in the address conversion table is updated to the value of the physical address subjected to the writing (Step S729-1).

Figure 34:
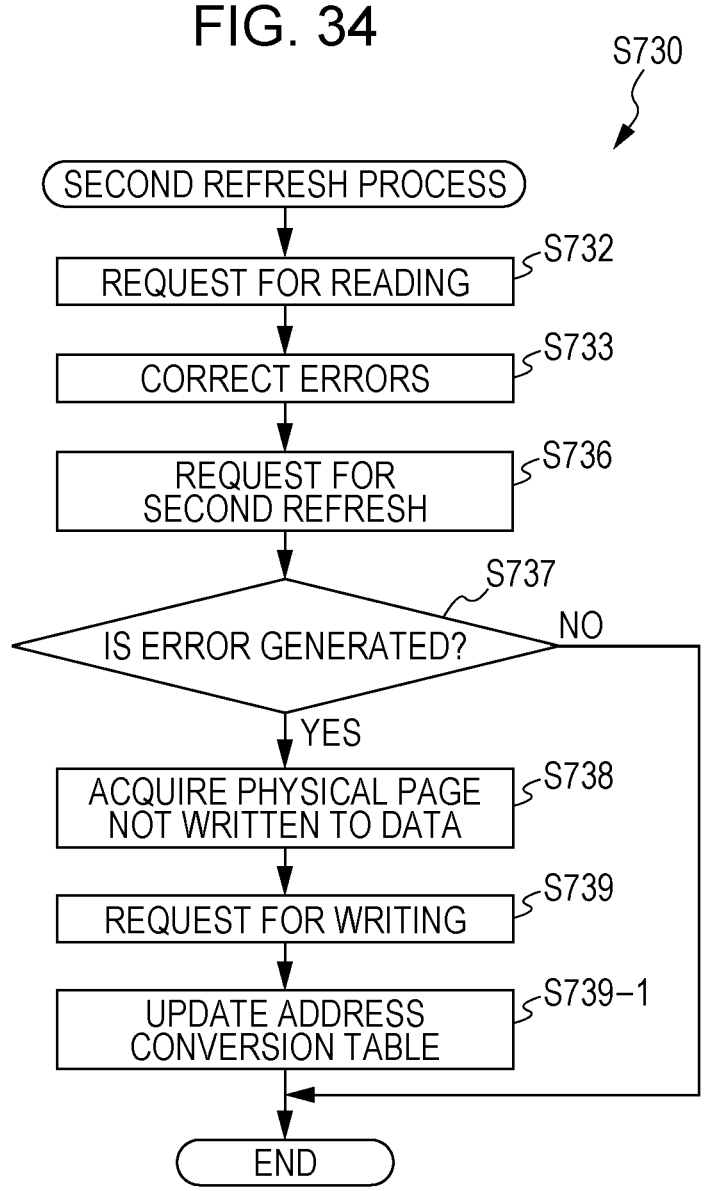
FIG. 34 is a flowchart showing an example of a process procedure of a second refreshing process (Step S730) of a memory controller according to a fifth embodiment of the present application.

FIG. 34 is a flowchart showing an example of a process procedure of the second refreshing process (Step S730) of the memory controller 200 according to the fifth embodiment of the present application.

The processor 210 designates the physical address selected in Step S711 and makes a request for reading with respect to the memory 300 (Step S732). The data read out from the memory 300 has 528 bytes including the unused area and the redundant bit.

The data having 528 bytes read out from the memory 300 is transmitted to the ECC processing unit 240. The ECC processing unit 240 performs the error correction of the data having 528 bytes, and retains the corrected result thereof (Step S733).

The processor 210 makes a request for the second refreshing of the physical address in which the error is generated, with respect to the memory 300 (Step S736). The second refreshing request process is performed in the memory 300 in the order described with reference to FIG. 17. The physical address designated in the second refreshing request process is the physical address selected in Step S711, and the data to be transmitted is the corrected data having 528 bytes retained in the FCC processing unit 240.

The processor 210 determines whether or not the error is generated in the process with respect to the request for the second refreshing (Step S737). When the error is not generated (Step S737: No), the refreshing process ends. When the error is generated (Step S737: Yes), the processor 210 acquires the physical address of the memory 300 which is not allocated to the logical address (Step S738). Then, the processor 210 designates the acquired physical address to make a request to the memory 300 for writing, and performs the writing of the data (Step S739). The data to be written is the data having 528 bytes subjected to the error correction and retained in the ECC processing unit 240. Then, the value of the physical address corresponding to the logical address subjected to the refreshing process in the address conversion table is updated to the value of the physical address subjected to the writing (Step S739-1).

First Modification Example

In the fifth embodiment described above, the memory controller 200 receives the notification of the date from the host computer 100, but the refreshing can be performed without receiving the notification of the date, in a case where the clock is provided in the memory controller 200. In this case, at the time of the application of the power of the storage system, and in a case where the date managed by the clock changes during the time the power is supplied, the refreshing execution confirmation process described above starts in order to determine whether or not to execute the refreshing process with respect to each physical page.

Second Modification Example

In the fifth embodiment described above, the example of using the first refreshing process of performing only the setting and the second refreshing process of performing the setting and resetting, is shown, but it is possible to realize the same details with another combination. Hereinafter, an example of using a third refreshing process of performing only the resetting and the first refreshing process of performing only the setting will be described as Second Modification Example.

Figure 35:
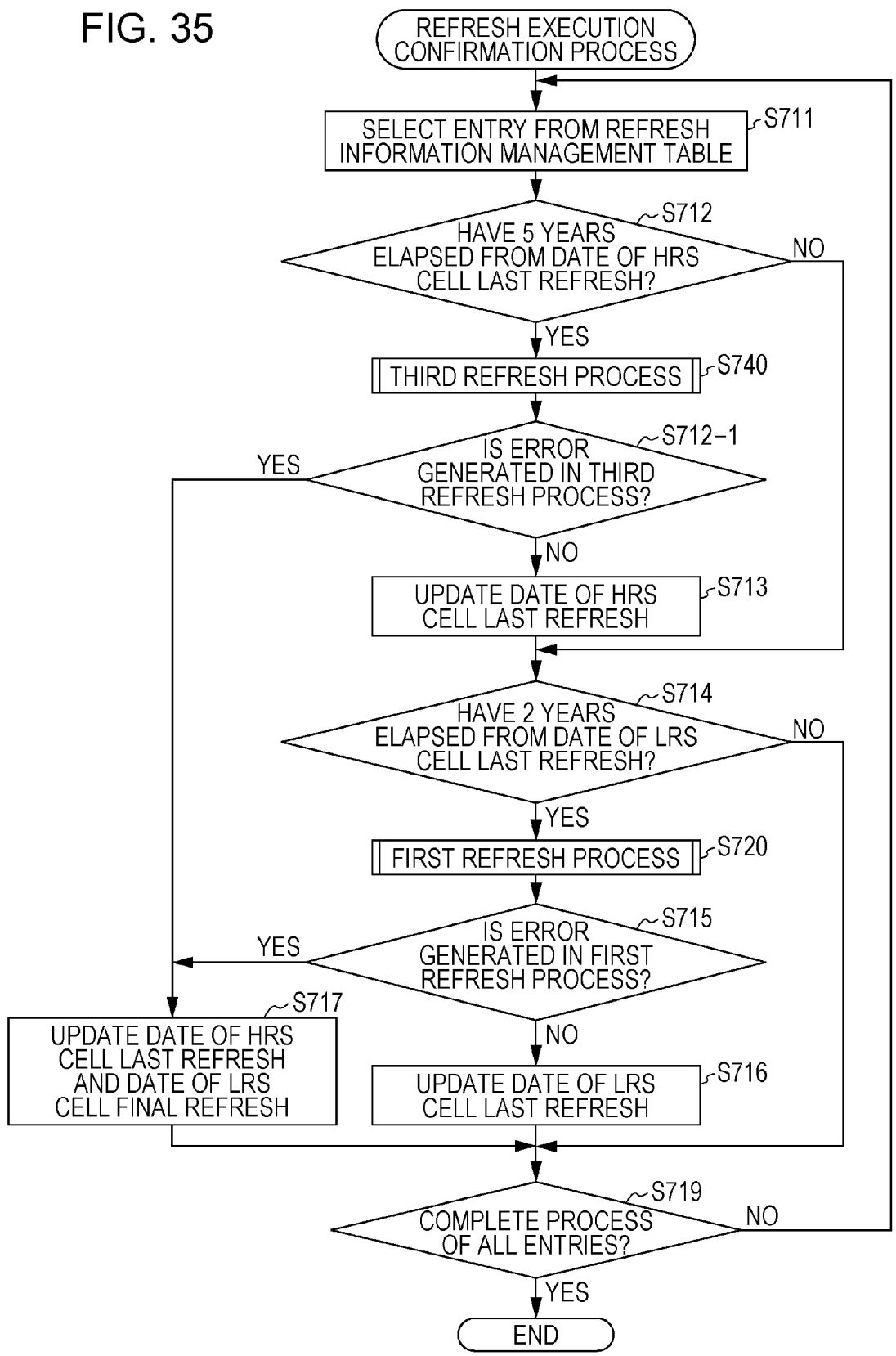
FIG. 35 is a flowchart showing a modification example of a refreshing execution confirmation process procedure of a memory controller according to a fifth embodiment of the present application.

FIG. 35 is a flowchart showing a modification example of the refreshing execution confirmation process procedure of the memory controller 200 according to the fifth embodiment of the present application. This modification example is different from the example described in FIG. 32 in branch destination of Step S712, Step S740, and Step S713, but the other points are the same.

When 5 years has not elapsed from the "date of last HRS cell refreshing" (Step S712: No), the processes in Step S714 and the subsequent steps are performed in the same manner as in the example of FIG. 32. Meanwhile, when 5 years has elapsed from the "date of last HRS cell refreshing" (Step S712: Yes), the third refreshing process (Step S740) is executed. At that time, when the error is generated in the third refreshing process (Step S712-1: Yes), the refreshing is assumed to be executed in the cells in the HRS and the LRS, and accordingly the date of last HRS cell refreshing and the date of last LRS cell refreshing are updated (Step S717). On the other hand, when the error is not generated in the third refreshing process (Step S712-1: No), the value of the "date of last HRS cell refreshing" is updated to the latest date retained in the refreshing information management unit 250 (Step S713).

Figure 36:
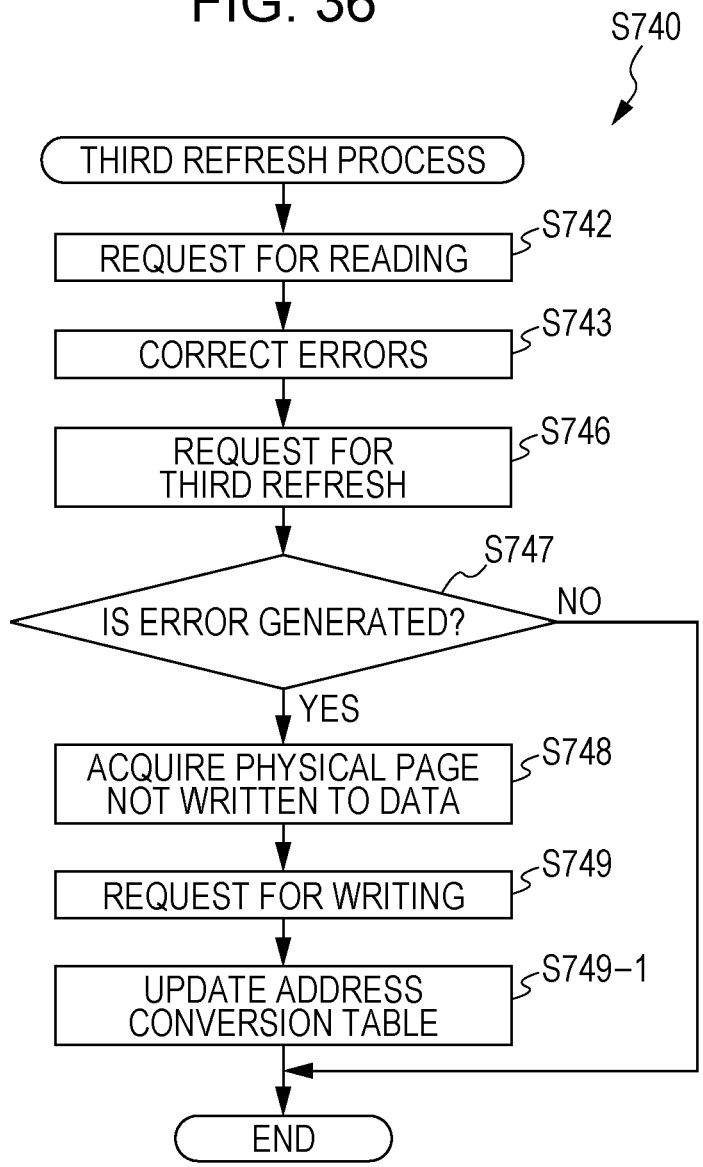
FIG. 36 is a flowchart showing an example of a process procedure of a third refreshing process (Step S740) of a memory controller according to a fifth embodiment of the present application.

FIG. 36 is a flowchart showing an example of a process procedure of the third refreshing process (Step S740) of the memory controller 200 according to the fifth embodiment of the present application.

The processor 210 designates the physical address selected in Step S711 and makes a request for reading with respect to the memory 300 (Step S742). The data read out from the memory 300 has 528 bytes including the unused area and the redundant bit.

The data having 528 bytes read out from the memory 300 is transmitted to the ECC processing unit 240. The ECC processing unit 240 performs the error correction of the data having 528 bytes, and retains the corrected result thereof (Step S743).

The processor 210 makes a request for the third refreshing of the physical address in which the error is generated, with respect to the memory 300 (Step S746). The third refreshing request process in the memory 300 will be described later.

The physical address designated in the third refreshing request process is the physical address selected in Step S711, and the data to be transmitted is the corrected data having 528 bytes retained in the ECC processing unit 240.

The processor 210 determines whether or not the error is generated in the process with respect to the request for the third refreshing (Step S747). When the error is not generated (Step S747: No), the refreshing process ends. When the error is generated (Step S747: Yes), the processor 210 acquires the physical address of the memory 300 which is not allocated to the logical address (Step S748). Then, the processor 210 designates the acquired physical address to make a request to the memory 300 for writing, and performs the writing of the data (Step S749). The data to be written is the data having 528 bytes subjected to the error correction and retained in the ECC processing unit 240. Then, the value of the physical address corresponding to the logical address subjected to the refreshing process in the address conversion table is updated to the value of the physical address subjected to the writing (Step S749-1).

Figure 37:
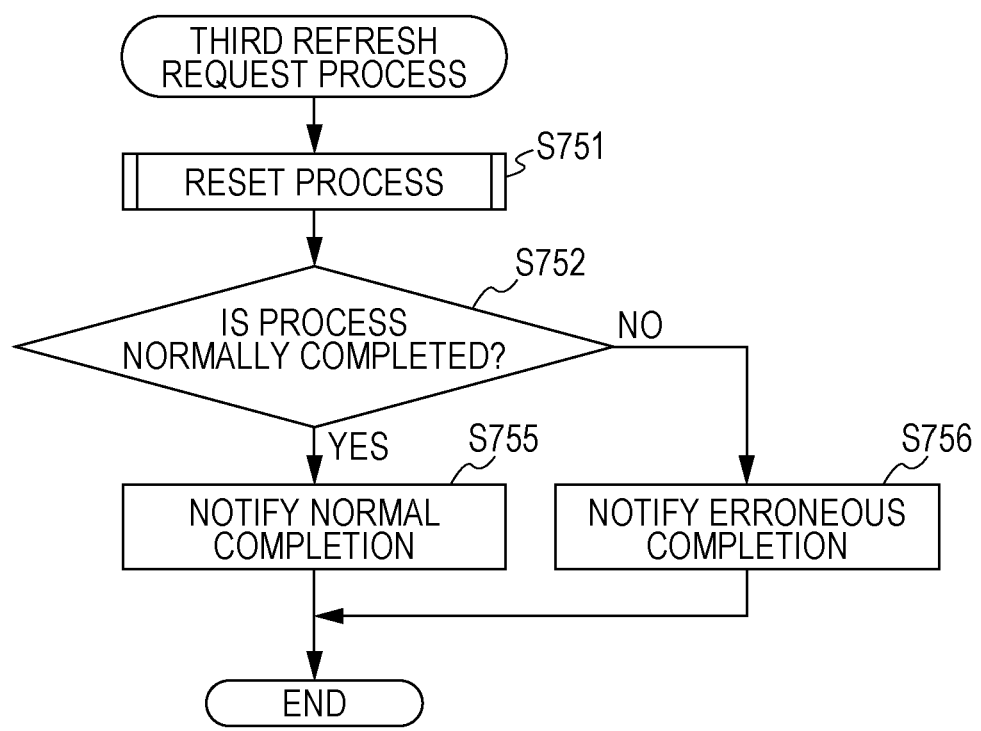
FIG. 37 is a flowchart showing an example of a process procedure of a third refreshing request process of a memory according to a fifth embodiment of the present application.

FIG. 37 is a flowchart showing an example of a process procedure of the third refreshing request process of the memory 300 according to the fifth embodiment of the present application. This third refreshing request process is started in response to the request in Step S746.

When the request for the third refreshing and the physical address are received from the memory controller 200 through the control interface 309, the request processing unit 360 starts the third refreshing request process. The data having 528 bytes necessary for the third refreshing request process is transmitted from the control interface 309 to the writing data buffer 341 and is retained therein. The physical address is transmitted from the control interface 309 to the request processing unit 360 and is retained therein.

The request processing unit 360 executes the resetting process (Step S751). This resetting process is the same as that described in FIG. 19.

After completing the resetting process, the request processing unit 360 determines whether or not this resetting process is properly completed (Step S752). When the process is properly completed (Step S752: Yes), the request processing unit 360 notifies the proper completion of the third refreshing request process, to the memory controller 200 through the control interface 309 (Step S755). On the other hand, when the process is erroneously completed (Step S752: No), the request processing unit 360 notifies the erroneous completion of the third refreshing request process, to the memory controller 200 through the control interface 309 (Step S756). After that, the request processing unit 360 completes the third refreshing request process.

6. OTHER MODIFICATION EXAMPLES

First Modification Example

Resetting Threshold Value and Setting Threshold Value

In the first to fourth embodiments described above, as shown in FIG. 5, the reading is performed using the reading threshold value in an intermediate position of the LRS and the HRS. With respect to this, when performing the refreshing, it is possible to improve the distribution of the resistance state as follows, by using threshold values more stringent than the normal case.

Figure 38:
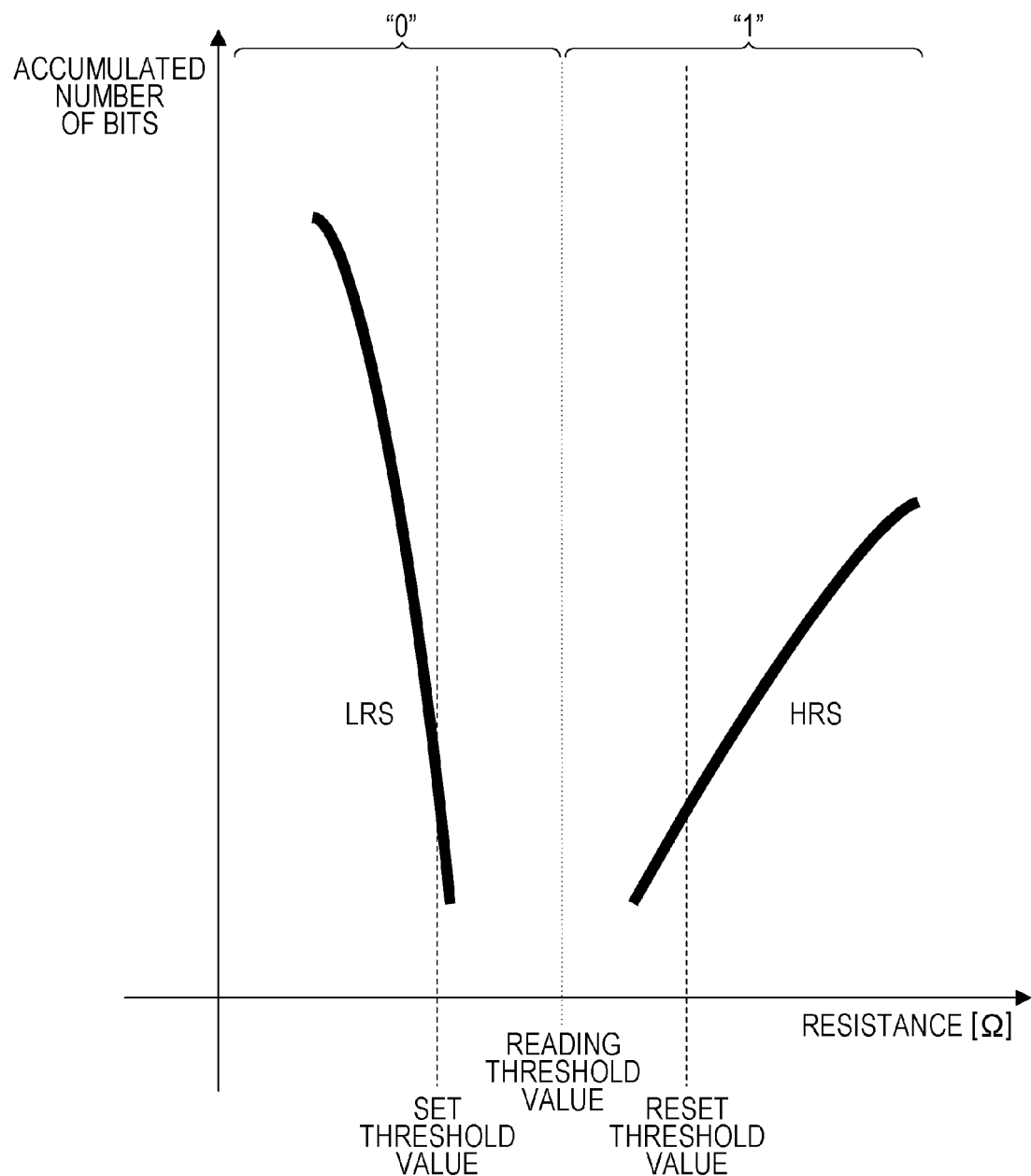
FIG. 38 is a diagram showing a relationship between a resistance distribution of a memory cell and threshold values of a modification example according to a fifth embodiment of the present application.

FIG. 38 is a diagram showing a relationship between a resistance distribution of the memory cell 313 and threshold values of the modification example according to the fifth embodiment of the present application. The drawing shows the resetting threshold value provided close to the HRS and the setting threshold value provided close to the LRS, in addition to the reading threshold value provided in the intermediate position of the LRS and the HRS.

In the setting operation of the first refreshing request process, when the data is read out by using the setting threshold value, a cell close to the HRS state among the cells in the LRS is also detected as the cell which is a target for applying the pulse. Accordingly, a cell in the LRS close to the reading threshold value is also returned to the high LRS state, and therefore strong refreshing is executed.

Further, in the setting operation of the second refreshing request process, by using the resetting threshold value in the resetting process, in addition to usage of the setting threshold value, the strong refreshing is also executed in the second refreshing request process.

Second Modification Example

Plurality of States

Figure 39:
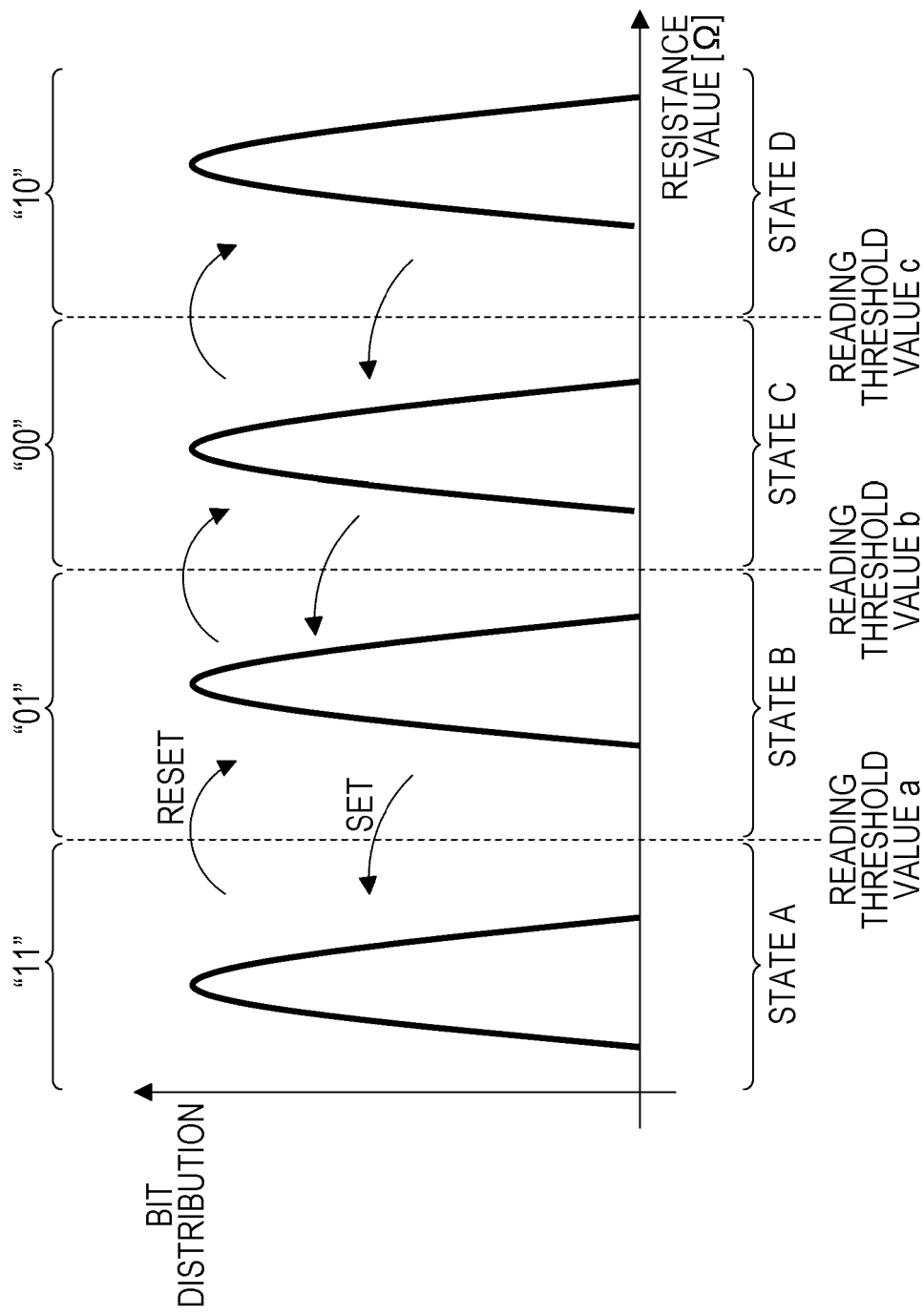
FIG. 39 is a diagram showing a resistance distribution chart for storing four states of a modification example according to an embodiment of the present application.

In the embodiments described above, the memory cells showing storage states of two states of LRS and HRS are assumed. However, the present application may also be applied to a memory configured with memory cells having more states than two states. As an example of such a memory configured with the memory cells, a memory which can store data having 2 bits in one memory cell is used. A resistance distribution chart of such a memory cell of the memory is shown in FIG. 39. FIG. 39 is a diagram showing a resistance distribution chart for storing four states of Modification Example according to an embodiment of the present application.

A memory cell having a resistance value in a range of a state A means including "11" as a storage state. A memory cell having a resistance value in a range of a state B means including "01" as a storage state. A memory cell having a resistance value in a range of a state C means including "00" as a storage state. A memory cell having a resistance value in a range of a state D means including "10" as a storage state. When the state of the memory cell is degraded by reading, the memory cell in the state A is transitioned to the state B, the memory cell in the state B is transitioned to the state C, and the memory cell in the state C is transitioned to the state D respectively.

By applying the present application, when the memory cell in the degraded state A is detected as the state B, the memory cell can be transitioned to the state A by the first refreshing request process, and the data recorded in the memory cell can be corrected. In addition, when the memory cell in the degraded state B is detected as the state A, the memory cell can be transitioned to the state B by the second refreshing request process, and the data recorded in the memory cell can be corrected.

CONCLUSION

As described above, in the embodiments described above, the request for the first refreshing of performing only the setting operation from the setting operation and the resetting operation is made according to the degraded state of the memory cell. Accordingly, the first refreshing request process is executed in many cases, and it is possible to realize a more rapid process than the second refreshing request process. In addition, in the first refreshing request process, the writing of the data by applying the pulse only to the cells in the degraded LRS is performed. Comparing to the normal refreshing process of performing the writing of the data with respect to all memory cells, the number of memory cells to which the stress is applied by single refreshing process is decreased, and therefore an effect of long life of the non-volatile memory is obtained, for example.

The embodiments described above are merely examples for realizing the present application, and the matters in the embodiments and matters used to specify the technology in claims are in a correspondence relationship. In the same manner, matters used to specify the technology in claims and matters having the same names in the embodiments are in a correspondence relationship. However, the present application is not limited to the embodiments, and can be realized by various modifications of the embodiments within a range not departing from a gist thereof.

The present application can have the following configurations.

(1) A storage control device including:
a detection unit which detects a first timing for performing a first rewriting process of performing only a first operation from among the first operation and a second operation, in a memory cell array in which each bit transitions to a first storage state by the first operation and transitions to a second storage state by the second operation; and
a request unit which makes a request for the first rewriting process with respect to the memory cell array, when the first timing is detected.

(2) The storage control device according to (1),
in which the detection unit detects the first timing when the number of bits obtained by reading out bits supposed to be in the first storage state as bits in the second storage state is greater than a predetermined number of bits.

(3) The storage control device according to (1) or (2),
in which the detection unit starts detection of the first timing, when the number of errors detected in the memory cell array is greater than a predetermined number of errors.

(4) The storage control device according to (1),
in which the detection unit compares the number of bits in the second storage state when predetermined data is written to the memory cell array, and the number of bits in the second storage state when the predetermined written data is read out from the memory cell array, and detects the first timing when the number of bits in the second storage state when the data is read out is greater.

(5) The storage control device according to (3) or (4),
in which the detection unit starts the detection of the first timing, when a difference between the number of bits in the second storage state when the data is written and the number of bits in the second storage state when the data is read out is greater than a predetermined number.

(6) The storage control device according to (1), further including:
an information management unit which records the number of times of reading for each physical address regarding the memory cell array,
in which the detection unit detects the first timing for the physical address in which the number of times of reading reaches a predetermined number of times.

(7) The storage control device according to (6),
in which the information management unit further records the number of times the power of the memory cell has been turned on, after making a request for a rewriting process of performing both the first operation and the second operation with respect to the memory cell array, and the detection unit makes a request for the rewriting process of performing both the first operation and the second operation with respect to the memory cell array, when the number of times the power has been turned on reaches the predetermined number of times.

(8) The storage control device according to any one of (1) to (7), in which the detection unit performs the detection of the first timing during execution of a reading command for performing reading-out from the memory cell array.

(9) The storage control device according to any one of (1) to (8), in which the detection unit spontaneously performs the detection of the first timing in a state where a command for accessing the memory cell array is not executed.

(10) The storage control device according to any one of (1) to (9), in which the detection unit detects the first timing when a predetermined period has elapsed after a first rewriting process is performed in the memory cell array, (11) The storage control device according to any one of (1) to (10), in which the detection unit further detects a second timing for performing a second rewriting process of performing both the first operation and the second operation, and the request unit makes a request for the second rewriting process with respect to the memory cell array when the second timing is detected.

(12) A storage device including:

a memory cell array in which each bit transitions to a first storage state by a first operation and transitions to a second storage state by a second operation;

a detection unit which detects a first timing for performing a first rewriting process of performing only the first operation from among the first operation and the second operation in the memory cell array; and a request unit which makes a request for the first rewriting process with respect to the memory cell array, when the first timing is detected.

(13) The storage device according to (12), in which each bit of the memory cell array is formed of a variable resistance element, the first storage state is a low resistance state, the second storage state is a high resistance state, the first operation is a setting operation for transitioning the bit to the low resistance state, and the second operation is a resetting operation for transitioning the bit to the high resistance state.

(14) An information processing system including:

a memory cell array in which each bit transitions to a first storage state by a first operation and transitions to a second storage state by a second operation;

a host computer which issues a reading command with respect to the memory cell array;

a detection unit which detects a first timing for performing a first rewriting process of performing only the first operation from among the first operation and the second operation regarding execution of the reading command; and a request unit which makes a request for the first rewriting process with respect to the memory cell array, when the first timing is detected.

(15) A storage control method including:

detecting a first timing for performing a first rewriting process of performing only a first operation from among the first operation and a second operation, in a memory cell array in which each bit transitions to a first storage state by the first operation and transitions to a second storage state by the second operation; and making a request for the first rewriting process with respect to the memory cell array, when the first timing is detected.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A storage control device comprising:
a detection unit which detects a first timing for performing a first rewriting process of performing only a first operation from among the first operation and a second operation, in a memory cell array in which each memory cell is configured to be transitioned to a first storage state by the first operation and to be transitioned to a second storage state by the second operation; and
a request unit which makes a request for the first rewriting process with respect to the memory cell array, when the first timing is detected,
wherein the first timing is when a number of errors in degraded first storage state or degraded second storage state is larger than a predetermined number.

2. The storage control device according to claim 1,
wherein the degraded first or second storage states are determined by whether or not a variation range of resistance in respective first and second storage states is across a reading threshold value.

3. The storage control device according to claim 2,
wherein the detection unit is configured to start detection of the first timing, when the number of errors detected in the memory cell array is greater than a predetermined number of errors.

4. The storage control device according to claim 1,
wherein the detection unit compares a first number of errors in the second storage state when predetermined data is written to the memory cell array with a second number of errors in the second storage state when the predetermined written data is read out from the memory cell array, and determines the first timing when the second number of errors in the second storage state is greater than the first number of errors.

5. The storage control device according to claim 4,
wherein the detection unit is configured to start the detection of the first timing, when a difference between the number of errors in the second storage state when the data is written and the number of errors in the second storage state when the data is read out is greater than a predetermined number.

6. The storage control device according to claim 1, further comprising:
an information management unit which records the number of times of reading for each physical address regarding the memory cell array,
wherein the detection unit detects the first timing for the physical address in which the number of times of reading reaches a predetermined number of times.

7. The storage control device according to claim 6,
wherein the information management unit further records the number of times the power of the memory cell has been turned on, after making a request for a rewriting process of performing both the first operation and the second operation with respect to the memory cell array, and the detection unit makes a request for the rewriting process of performing both the first operation and the second operation with respect to the memory cell array, when the number of times the power has been turned on reaches the predetermined number of times.

8. The storage control device according to claim 1, wherein the detection unit is configured to perform the detection of the first timing during execution of a reading command for performing reading-out from the memory cell array.

9. The storage control device according to claim 1, wherein the detection unit spontaneously performs the detection of the first timing in a state where a command for accessing the memory cell array is not executed.

10. The storage control device according to claim 1, wherein the detection unit detects the first timing when a predetermined period has elapsed after a first rewriting process is performed in the memory cell array.

11. The storage control device according to claim 1, wherein the detection unit further detects a second timing for performing a second rewriting process of performing both the first operation and the second operation when the number of errors in degraded first storage state or degraded second storage state is not larger than the predetermined number, and the request unit makes a request for the second rewriting process with respect to the memory cell array when the second timing is detected.

12. A storage device comprising:
a memory cell array in which each memory cell is configured to be transitioned to a first storage state by a first operation and to be transitioned to a second storage state by a second operation;
a detection unit which detects a first timing for performing a first rewriting process of performing only the first operation from among the first operation and the second operation in the memory cell array; and
a request unit which makes a request for the first rewriting process with respect to the memory cell array, when the first timing is detected,
wherein the first timing is when a number of errors in degraded first storage state or degraded second storage state is larger than a predetermined number.

13. The storage device according to claim 12, wherein each memory cell of the memory cell array is formed of a variable resistance element,
the first storage state is a low resistance state,
the second storage state is a high resistance state,
the first operation is a setting operation for transitioning the memory cell to the low resistance state, and
the second operation is a resetting operation for transitioning the memory to the high resistance state.

14. An information processing system comprising:
a memory cell array in which each memory cell is configured to be transitioned to a first storage state by a first operation and to be transitioned to a second storage state by a second operation;
a host computer which issues a reading command with respect to the memory cell array;
a detection unit which detects a first timing for performing a first rewriting process of performing only the first operation from among the first operation and the second operation regarding execution of the reading command; and
a request unit which makes a request for the first rewriting process with respect to the memory cell array, when the first timing is detected,
wherein the first timing is when a number of errors in degraded first storage state or degraded second storage state is larger than a predetermined number.

15. A storage control method comprising:
detecting a first timing for performing a first rewriting process of performing only a first operation from among the first operation and a second operation, in a memory cell array in which each memory cell is configured to be transitioned to a first storage state by the first operation and to be transitioned to a second storage state by the second operation; and
making a request for the first rewriting process with respect to the memory cell array, when the first timing is detected,
wherein the first timing is when a number of errors in degraded first storage state or degraded second storage state is larger than a predetermined number.

16. The storage control device according to claim 11, wherein the first rewriting process is faster than the second rewriting process.

* * * * *